United States Patent
Takeuchi et al.

(10) Patent No.: US 6,396,193 B1
(45) Date of Patent: *May 28, 2002

(54) PIEZOELECTRIC/ELECTROSTRICTIVE DEVICE HAVING MUTUALLY OPPOSING THIN PLATE PORTIONS

(75) Inventors: Yukihisa Takeuchi, Nishikamo-Gun; Tsutomu Nanataki, Toyoake; Masato Komazawa; Koji Kimura, both of Nagoya, all of (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/628,232

(22) Filed: Jul. 28, 2000

Related U.S. Application Data

(63) Continuation-in-part of application No. 09/494,075, filed on Jan. 28, 2000.

(30) Foreign Application Priority Data

| Oct. 1, 1999 | (JP) | 11-281522 |
| Oct. 28, 1999 | (JP) | 11-307844 |
| Jan. 24, 2000 | (JP) | 2000-15123 |
| Jun. 30, 2000 | (JP) | 2000-200038 |

(51) Int. Cl.[7] .................... H01L 41/08
(52) U.S. Cl. .................... 310/321; 310/328
(58) Field of Search .................... 310/328, 330, 310/348, 324, 321

(56) References Cited

U.S. PATENT DOCUMENTS 6,109,104 A * 8/2000 Fukuda et al. ............ 75/504.13

* cited by examiner

Primary Examiner—Brian Sircus
Assistant Examiner—Michael C. Zarroli
(74) Attorney, Agent, or Firm—Burr & Brown

(57) ABSTRACT

A piezoelectric/electrostrictive device includes a driving portion, a movable portion and a fixing portion. The driving portion includes a pair of mutually opposing thin plate portions and a piezoelectric/electrostrictive (P/E) element. A P/E operating portion of the P/E element is arranged on at least a part of an outer surface of at least one of the thin plate portions, such that one end thereof exists on the fixing portion or the movable portion and the other end thereof is arranged on the thin plate portion. At least one end of a P/E layer of the P/E element exists on the fixing portion or the movable portion, and the other end is arranged on the thin plate portion.

11 Claims, 25 Drawing Sheets

Fig. 19
CERAMIC GREEN SHEET 2 FOR THIN PLATE
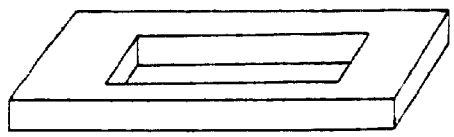
CERAMIC GREEN SHEET 4
HAVING A HOLE FORMED THEREON
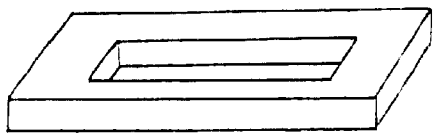
CERAMIC GREEN SHEET 3
HAVING A HOLE FORMED THEREON
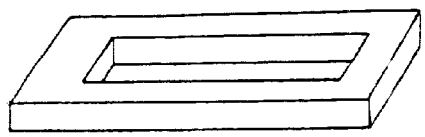
CERAMIC GREEN SHEET 2
HAVING A HOLE FORMED THEREON
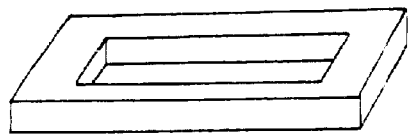
CERAMIC GREEN SHEET 1
HAVING A HOLE FORMED THEREON
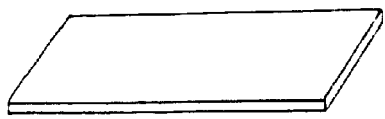
CERAMIC GREEN SHEET 1 FOR THIN PLATE

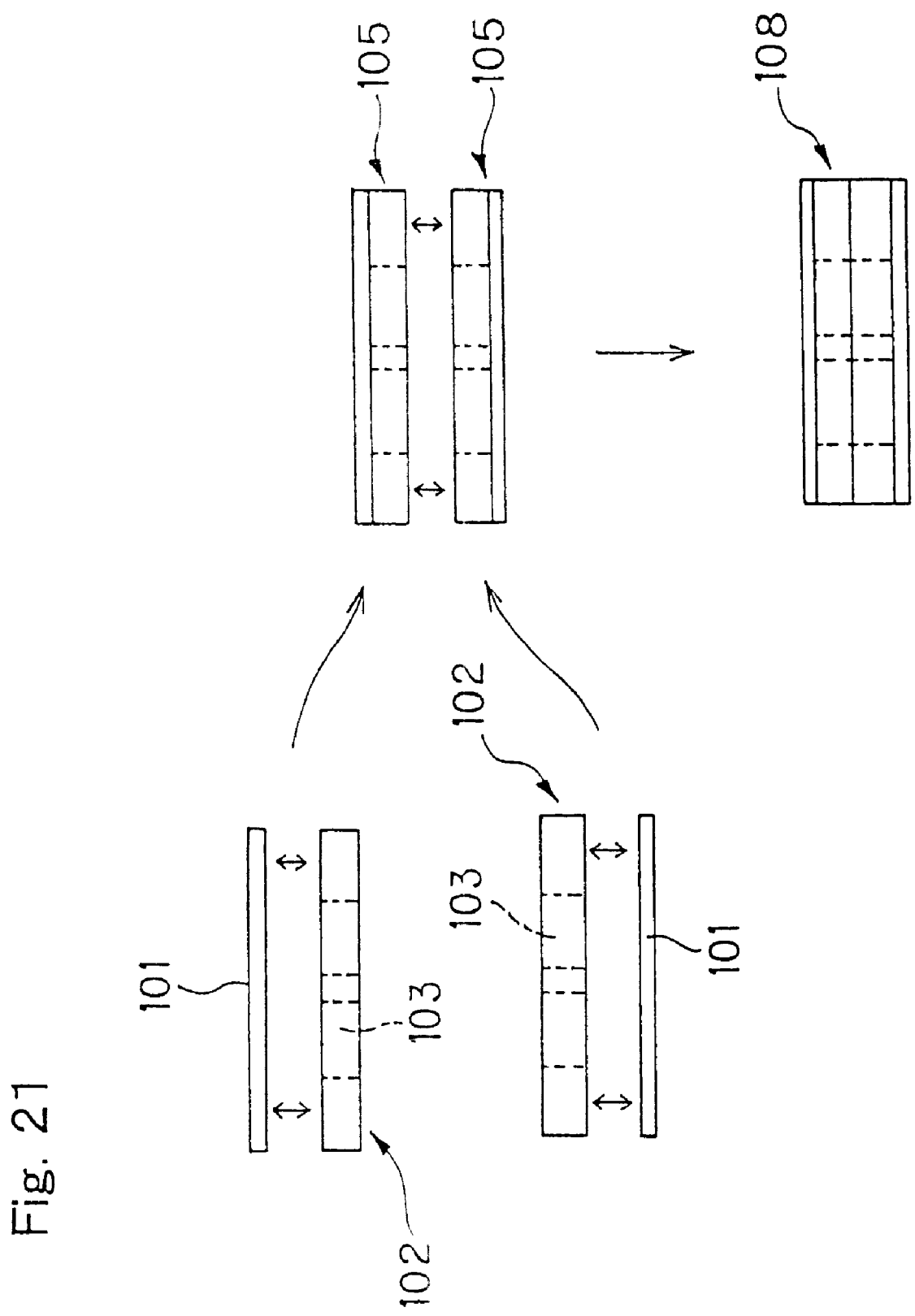

Fig. 27 - Pior Art
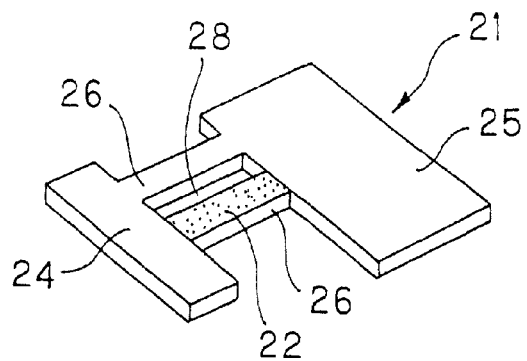
Fig. 28(a)
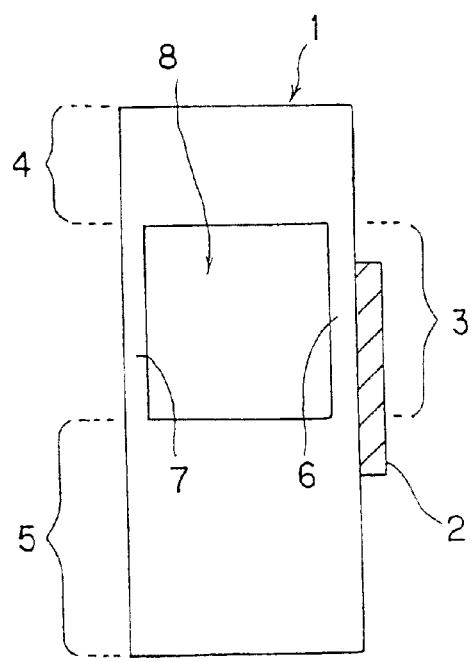
Fig. 28(b)
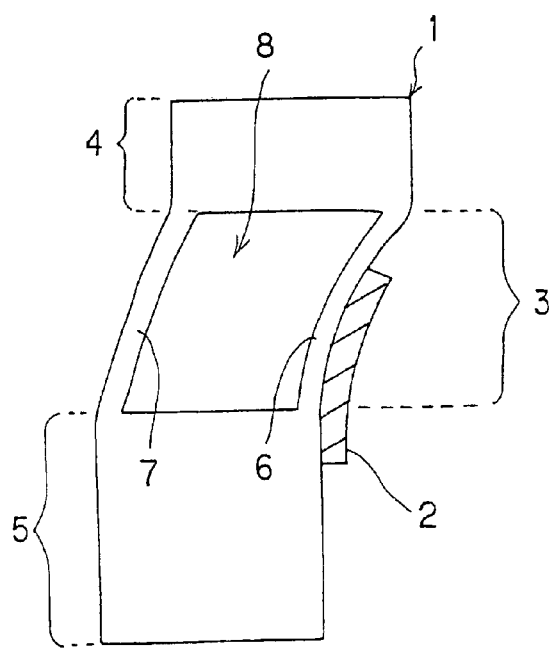

PIEZOELECTRIC/ELECTROSTRICTIVE DEVICE HAVING MUTUALLY OPPOSING THIN PLATE PORTIONS

CROSS-REFERENCE OF RELATED APPLICATION

The present application is a continuation-in-part application of the pending U.S. patent application Ser. No. 09/494,075 filed on Jan. 28, 2000.

BACKGROUND OF THE INVENTION AND RELATED ART STATEMENT

The present invention relates to a piezoelectric/electrostrictive device comprising a movable portion being operated based on a displacement of a piezoelectric/electrostrictive element, or to a piezoelectric/electrostrictive device capable of detecting a displacement of a movable portion by a piezoelectric/electrostrictive element, and more particularly relates to a piezoelectric/electrostrictive device which is superior in the mechanical strength, impact resistance, and humidity resistance, and capable of having the movable portion efficiently operated in large magnitude substantially in parallel toward the direction of a specific axis.

In recent years, in the fields of optics, magnetic recording, precision machining, and the like, a displacement element capable of adjusting an optical path length or a position in sub-micron order has been required, and development has been progressed of a displacement element utilizing a displacement due to the inverse piezoelectric effect or the electrostrictive effect caused when a voltage is applied to a piezoelectric/electrostrictive material (for example, a ferroelectric substance or the like). For example, as shown in FIG. 27, a piezoelectric actuator 21 is disclosed, in which, by providing a hole 28 on a board-like shaped body composed of a piezoelectric/electrostrictive material, a fixing portion 25, movable portion 24, and a beam 26 connecting therewith are integrally formed, and the beam 26 is further provided with an electrode layer 22 (See JP-A-10-136665).

In the actuator 21, when a voltage is applied across the electrode layer 22, the beam 26 expands or contracts, in a direction in which the fixing plate 25 is connected with the movable portion 24, by the inverse piezoelectric effect or the electrostrictive effect, thus enabling the movable portion 24 to have an arc-shaped displacement or a rotational displacement in-plane of the board-like shaped body. On the other hand, the JP-A-63-64640 discloses a technique with regard to an actuator utilizing a bimorph, wherein an electrode of the bimorph is split to be provided, and by driving the actuator by selecting the split electrodes, precise positioning can be performed at a high speed, and, for example, a structure for using two bimorphs opposed each other is shown in the specification thereof.

However, in the above-described actuator 21, as the displacement in an expanding or contracting direction (namely, in-plane direction of the board-like shaped body) of a piezoelectric/electrostrictive material is transmitted per se to the movable portion, there is a problem that an operational quantity of the movable portion 24 is small. Moreover, the actuator 21, having all the members thereof being composed of a piezoelectric/electrostrictive material which is fragile and comparatively heavy, has another problem that the actuator 21 per se is heavy and operationally likely to be influenced by harmful vibrations, for example, residual vibrations or noise vibrations when operated at a high speed, in addition to being low in the mechanical strength, inferior in the handling property, impact resistance, and humidity resistance.

In order to solve the above-described problems in the actuator 21, a proposition has been made that a filler having plasticity is filled to the hole 28, however, when the filler is used, it is apparent that the efficiency of the displacement due to the inverse piezoelectric effect or the electrostrictive effect is reduced.

On the other hand, what is shown in FIG. 4 of JP-A-63-64640 is that, in a bonding manner of a relaying member with a bimorph and a head with a bimorph, a so-called piezoelectric/electrostrictive operating portion expressing strain strides over each of the jointed portions, i.e., the bimorph strides continuously from the relaying member and the head. As a result, the displacement motion occurring from the jointed portion between the relaying member and the bimorph as a fulcrum and the displacement motion occurring from the jointed portion between the head and the bimorph as a fulcrum interfere with each other and hinder the development of the displacement when the bimorph is operated, and thus the structure is that an action for effectively displacing the head per se toward the outer space is unable to be obtained.

In addition, the actuator disclosed in JP-A-63-64640 is so structured that a displacement generating member and a so-called frame member (relaying member, or the like) are separately prepared, and then adhered to be incorporated, and consequently the structure is that the joined state of the frame with the bimorph is likely to vary with time in accordance with operation of the bimorph, and that drifting of the displacement, exfoliation, or the like is also likely to be caused. Furthermore, a structure having an adhesive agent at a joined portion of the bimorph with the relaying member and at a joined portion of the head with the bimorph, namely at a holding portion of a displacement member, is low in stiffness of the holding portion per se, thus increase in the resonant frequency which is required in high speed operation is difficult to be obtained.

Of course, the applicant of the present invention and the others have made a proposition of a piezoelectric/electrostrictive device capable of solving such problems in the specification of Japanese Patent Application No. 11-375581, or the like, however, a piezoelectric/electrostrictive device which is capable of further increasing the displacement quantity of a movable portion, and making the displacement path of the movable portion substantially parallel relative to the fixing portion, is sought after specifically as a precise positioning device in the fields of magnetic recording and optics.

The present invention is made in view of the above-described current situation, and an object thereof is to provide a displacement element which is capable of further increasing displacement quantity of the movable portion and making a displacement path of the movable portion substantially in parallel relative to the fixing portion without reducing resonance frequency, and a sensor element capable of detecting vibrations of the movable portion in high precision.

SUMMARY OF THE INVENTION

According to the present invention, firstly provided is a piezoelectric/electrostrictive device comprising a driving portion to be driven by a displacement of a piezoelectric/electrostrictive element, a movable portion to be operated based on the drive of the driving portion, and a fixing portion for holding the driving portion and the movable portion, the movable portion being coupled with the fixing portion via the driving portion, and a hole being formed by inner walls of the driving portion, an inner wall of the movable portion, and an inner wall of the fixing portion, and the piezoelectric/electrostrictive device comprises the driving portion comprising a pair of mutually opposing thin plate portions, and a piezoelectric/electrostrictive element including a piezoelectric/electrostrictive operating portion comprising a pair or more of electrodes and a piezoelectric/electrostrictive layer arranged on at least at a part of the outer surface of at least one thin plate portion out of the thin plate portions, one end of the piezoelectric/electrostrictive operating portion in a direction in which the fixing portion is connected with the movable portion exists on the fixing portion or the movable portion, and the other end of the piezoelectric/electrostrictive operating portion is arranged on the thin plate portion, and at least one end of the piezoelectric/electrostrictive layer of the piezoelectric/electrostrictive element exists on the fixing portion or the movable portion, and the other end thereof is arranged on the thin plate portion, and the Young's modulus Y1 of a material composing the thin plate portions and the Young's modulus Y2 of a material composing a material of the piezoelectric/electrostrictive layer have a relationship that satisfies the following expression, namely;

$$1 < Y1/Y2 \leq 20.$$

Here, so long as being within a range satisfying the relationship of the Young's moduli described above, the movable portion, the thin plate portions, and the fixing portion may be composed of a ceramic or a metal, or respective members may be mutually composed of ceramic materials, or metallic materials, or may be composed as a hybrid by combining the members fabricated with ceramic materials and the members fabricated with metallic materials.

Further provided are a piezoelectric/electrostrictive device in which a movable portion, thin plate portions, and a fixing portion are integrally formed by a ceramic green sheet laminated body being simultaneously sintered, a piezoelectric/electrostrictive device wherein a piezoelectric/electrostrictive element has a film-like piezoelectric/electrostrictive element directly formed on the thin plate portion and the movable portion or the fixing portion, and integrally formed by having them sintered, and a piezoelectric/electrostrictive device in which the piezoelectric/electrostrictive layer of the film-like piezoelectric/electrostrictive element is not contained of any glass frit.

Further provided are a piezoelectric/electrostrictive device in which a movable portion displaces so as to satisfy an expression of;

$$0° \leq \theta \leq 0.1°$$

relative to an angle θ formed by a side of the movable portion, opposing to the fixing portion, in a displaced state and the same side of the movable portion prior to the displacement, a piezoelectri-c/electrostrictive device in which the length L of a portion arranged on the thin plate portion out of the piezoelectric/electrostrictive operating portion satisfies the following expression, relative to the length e of the thin plate portion and the thickness d of the thin plate portion, namely;

$$30 \leq (L/e) \times 100 \leq 100 - d/2.5,$$

and a piezoelectric/electrostrictive device in which, in a virtual circle having the center thereof on a perpendicular dropped from the middle point of a side, opposing to the fixing portion, of the movable portion, in a non-displacement state, to the fixing portion, passing through the middle point of the movable portion in the non-displacement state and the middle point of movable portion displaced by operation of the driving portion, the movable portion displaces so as to satisfy the following expression of a relationship between the radius r of the virtual circle and the length e of the thin plate portion, the expression being;

$$0 \leq e/r \leq 100,$$

and when driven by a displacement of the piezoelectric/electrostrictive element, an inflection point of the displacement exists on the thin plate portion.

Further provided in the present invention are a piezoelectric/electrostrictive device in which the length L of the piezoelectric/electrostrictive operating portion arranged on the thin plate portion satisfies the following expression, in relationship with the length e of the thin plate portion and the thickness d of the thin plate portion, the expression being;

$$40 \leq (L/e) \times 100 \leq 100 - d/1.5,$$

a piezoelectric/electrostrictive device in which, in a virtual circle having the center thereof on a perpendicular dropped from the middle point of a side, opposing to the fixing portion, of the movable portion in a non-displacement state, to the fixing portion, and passing through the middle point of the movable portion in the non-displacement state and the middle point of the movable portion displaced by operation of the driving portion, the movable portion displaces such that a relationship between the radius r of the virtual circle and the length e of the thin plate portion satisfies the following expression, the expression being:

$$0 \leq e/r \leq 20,$$

and an inflection point of the displacement of the thin plate portions exists at a position parted more than one half of the length of the thin plate portion from a joined portion of the fixing portion, or the movable portion with the thin plate portion: the piezoelectric/electrostrictive operating portion existing on either portion of the fixing portion, or the movable portion, and a piezoelectric/electrostrictive device in which, relative to the thickness a of the hole and the length e of the thin plate portion, the ratio e/a is 0.1 to 2, and relative to the thickness a of the hole and width b of the thin plate portion, the ratio a/b is 0.05 to 2.

Further, a piezoelectric/electrostrictive device of the present invention preferably have a movable portion, thin plate portions, and a fixing portion, composed of ceramics integrally formed, more preferably have the movable portion, the thin plate portions, and the fixing portion, composed of a material containing fully-stabilized zirconia as the major component, or a material containing partially-stabilized zirconia as the major component, and most preferably have at least the movable portion, the thin plate portions, and the fixing portion, composed by a sintered ceramic green laminated body. The reason is that joined portions with the movable portion, the thin plate portions, and the fixing portion can be structured to be without boundary by being integrated by sintering, thus long term reliability with time of such portions can be raised, a phenomenon such as drifting or the like as variation with time of the device by the displacement can be suppressed to be minimum, and a large displacement can be developed with higher reproducibility. On the other hand, when at least the thin plate portions are composed of a metallic material as described previously, a device superior in the handling property and impact resistance can be provided.

It should be noted that, when fabricating a device of a structure according to the present invention, in addition to the method where all members thereof are integrated by sintering, there is a method in that a laminated body split in a mutually opposing direction of the thin plate portions, namely a ceramic laminated body comprising a thin plate and a member to be a rectangular fixing portion and movable portion is prepared, a piezoelectric/electrostrictive element is formed by the screen printing at predetermined positions of the thin plate portion and the fixing portion or the movable portion, and integrally sintered with the ceramic laminated body to prepare at least two of the sintered structures, and the sintered structures are joined together so as to have thin plate portions to be parted each other, namely to have the above-mentioned members respectively to be a fixing portion and a movable portion mutually matched by use of an adhesive or the like such as glass or an organic resin. However, a device fabricated first by integrating the movable portion, the thin plate portions, and the fixing portion by simultaneous sintering, and then a piezoelectric/electrostrictive element film being formed on the sintered body, and finally by integrally sintering the body thus formed, is preferable as the device has no discontinuous portion as a structure such as a joined portion where the third party intervenes, thus the device thus fabricated is superior in stability and reliability even if a stress is applied thereon by operation of the driving portion, which is preferable.

Moreover, in a piezoelectric/electrostrictive device of the present invention, it is preferable that a piezoelectric/electrostrictive layer constituting a piezoelectric/electrostrictive element is composed of a material containing a mixture of lead zirconate, lead titanate, and lead magnesium niobate as the major component, and a material containing sodium bismuth titanate as the major component is also preferable. Details of materials to be used are to be described later.

It should be noted that, in the present specification, a terminology "operate in substantially parallel" means, with reference to FIG. 26, when both ends of the right-hand side and the left-hand side of the hole at the joined portion of the movable portion with both thin plate portions in a state when the device is not driven are respectively set as the point A and the point B, while positions of the both ends in a state when the device is driven at a predetermined voltage are made as the point C and the point D, that a displacement is performed within a range where an angle θ to be formed by a segment passing through the point D and parallel to a segment AB and a segment CD satisfies the following expression, namely;

$$0° \leq \theta \leq 0.1°.$$

For this value, displacement quantities at above-described respective points are measured by the laser Doppler vibrometer (made by Graphtec Corp), and the value is derived by calculating the measured displacement quantities.

In the present invention, "film-like" means what is formed by the thick film or thin film forming method, as to be described hereinafter, and ordinarily, it is distinguished from the one formed by adhering plate-shaped piezoelectric/electrostrictive elements composed of apiezoelectric plates by use of an adhesive. Further, "piezoelectric/electrostrictive device (hereinafter simply referred to as "device") according to the present specification is a notion implying an element for alternatively converting an electrical energy into a mechanical energy by way of a piezoelectric/electrostrictive material. Accordingly, the device can be preferably used as an active element for a variety of actuators, oscillators, and the like, particularly as a displacement element utilizing a displacement of the inverse piezoelectric effect or the electrostrictive effect, however, it can also be used as a passive element for an acceleration sensor element, an impact sensor element, or the like.

A piezoelectric/electrostrictive element is an element comprising a pair or more of electrodes and a piezoelectric/electrostrictive layer, for being driven based on a signal to be transmitted, and for performing a function of transmitting the movement thereof to the thin plate portions. In the element, a piezoelectric/electrostrictive operating portion is a portion to substantially move the piezoelectric/electrostrictive element so as to move the movable portion in a predetermined operation in accordance with a signal given to said piezoelectric/electrostrictive element, and composed of a portion where a pair or more of electrodes and a piezoelectric/electrostrictive layer are mutually overlapped. It should be noted that "having multiple layers of piezoelectric/electrostrictive operating portions" means that a plurality of piezoelectric/electrostrictive operating portions are arranged in layers in a direction perpendicular to the main surface of the thin plate portions, namely in the thickness direction of the thin plate portions. Respective electrodes which constitute respective piezoelectric/electrostrictive operating portions may have a structure being shared between operating portions, or a structure made to be in common use, or a structure to be mutually independent. A predetermined signal is transmitted to respective electrodes constituting respective operating portions, and an electric field is applied to a piezoelectric/electrostrictive layer constituting respective operating portions.

Moreover, "piezoelectric" means "piezoelectric and/or electrostrictive". "Length" means a distance in a direction in which a movable portion is connected with a fixing portion, namely in the Z-axis direction in drawings, "width" means a distance in a direction penetrating through a hole, namely in the Y-axis direction in drawings, and "thickness" means a distance in a direction in which a piezoelectric/electrostrictive device is laminated with a thin plate portion, namely in the X-axis direction in drawings. It should be noted that in drawings those having the same or similar function is in principle indicated by the same symbol.

Inflection point means a point where the bending direction is changed in a bend of the thin plate portion caused by operation of a piezoelectric/electrostrictive element, and this may be described by use of a piezoelectric/electrostrictive element in the left-hand side in FIG. 2(b) that, in the portion lower than the point indicated as the inflection point, the vertex of the bend is oriented toward a hole, and in the portion upper than the point indicated as the inflection point, the vertex of the bend is oriented toward outside, thus forming a bend, and the boundary is the inflection point. Ordinarily, the inflection point exists in the vicinity of the tip of a piezoelectric operating portion comprising a portion where a pair or more of electrodes and a piezoelectric/electrostrictive layer formed on thin plate portion are mutually overlapped.

BRIEF DESCRIPTION OF DRAWINGS

FIG. 2(a) shows a state prior to a displacement, with a symbol "e" showing a length of thin plate portions.

FIG. 19 shows perspective views exemplarily showing examples of respective ceramic green sheets to be used in a ceramic green sheet laminated body when fabricating a piezoelectric/electrostrictive device of the present invention.

FIG. 21 shows side views of another embodiment of a method of fabricating a piezoelectric/electrostrictive device of the present invention.

FIG. 22(a) shows a perspective view thereof and FIG. 22(b) shows a top view thereof.

FIGS. 23 (a), (b), and (c) show schematic explanatory views of another embodiment of an optical shutter of the present invention.

FIG. 27 shows a schematic perspective view of an embodiment of a conventional piezoelectric actuator.

FIGS. 28 (a) and (b) show a sectional view exemplarily showing a displacement state of a piezoelectric/electrostrictive device of the present invention, and FIG. 28(a) shows a sectional view exemplarily showing a state prior to a displacement, and FIG. 28(b) shows a sectional view exemparily showing a state after the displacement.

BEST MODE OF CARRYING OUT THE INVENTION

A piezoelectric/electrostrictive device of the present invention is hereinafter described with reference to drawings. However, the present invention is not limited to illustrated embodiments shown in drawings.

Figure 1:
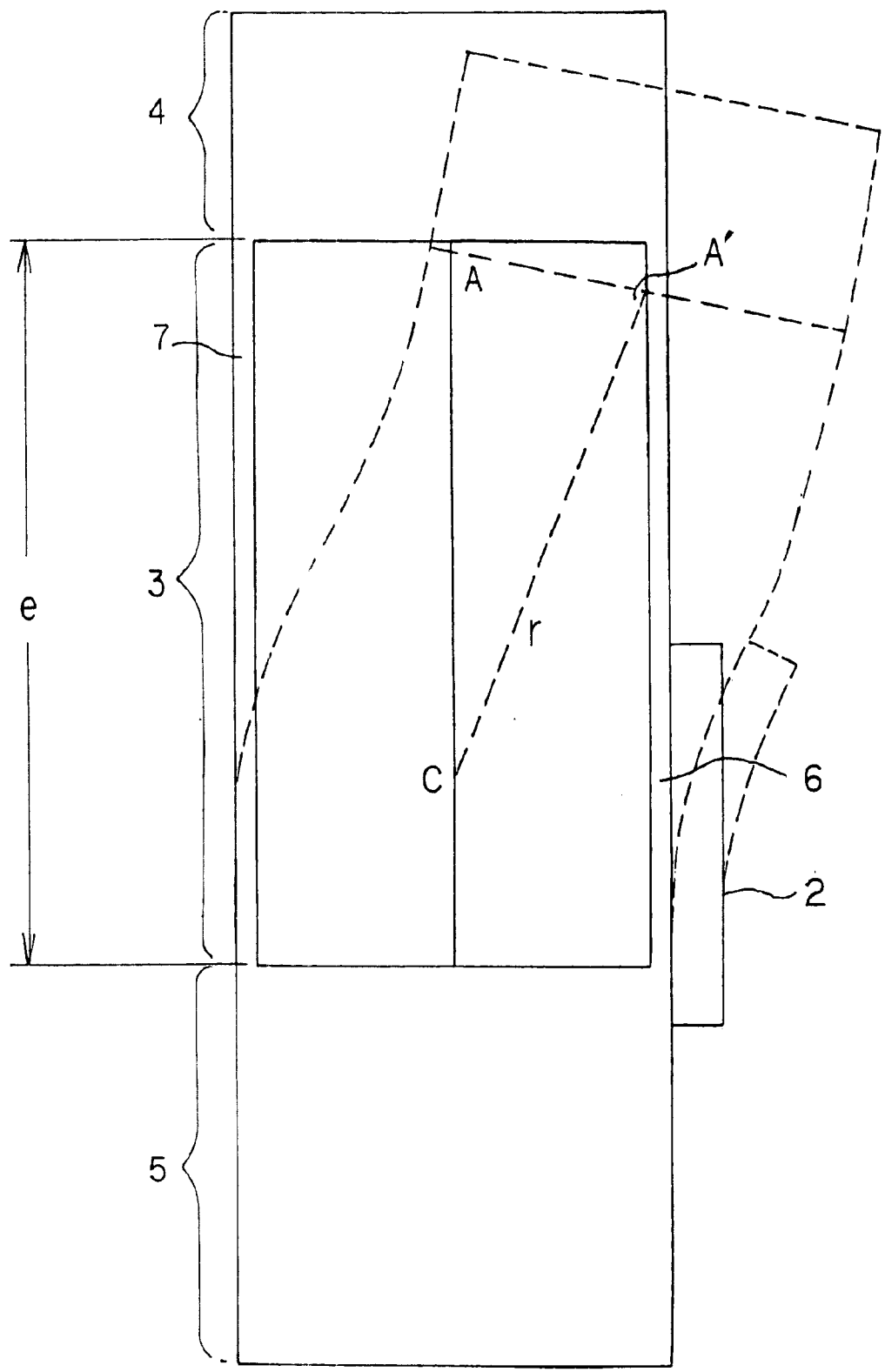
FIG. 1 shows a schematic explanatory view describing an operational state of a piezoelectric/electrostrictive device of the present invention.

As exemplarily shown in FIG. 1, a device according to the present invention has a mechanism to drive a movable portion substantially in parallel to the X-axis, and in extremely large magnitude as a conventional device of this sort. The reason that a movable portion 4 largely operates in a specific direction, in the X-axis direction in the case of FIG. 1, is that one end of a piezoelectric/electrostrictive operating portion 2' in a direction in which a fixing portion 5 is connected with the movable portion 4 of a piezoelectric/electrostrictive element 2 including the piezoelectric/electrostrictive operating portion 2' comprising a pair of the electrodes and a piezoelectric/electrostrictive layer exists on the fixing portion 5 or the movable portion 4, and the other end of the piezoelectric/electrostrictive operating portion 2' is arranged on thin plate portion 6, at least one end of a piezoelectric/electrostrictive layer of the piezoelectric/electrostrictive 2 exists on the fixing portion 5 or the movable portion 4, and the other end thereof is arranged on the thin plate portion 6, and the Young's modulus Y1 of a material composing the thin plate portions 6 and 7 and the Young's modulus Y2 of a material composing the piezoelectric/electrostrictive layer 2a have a relationship that satisfies the following expression;

$$1 < Y1/Y2 < 20.$$

Figure 2A:
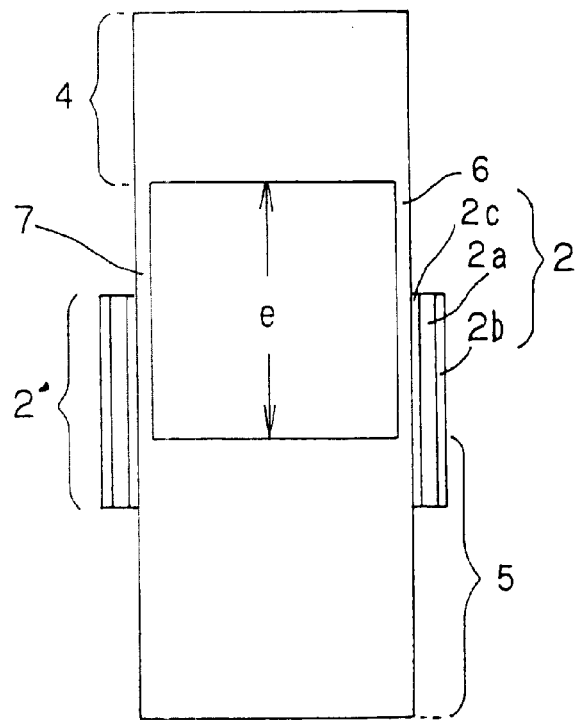
FIGS. 2(a) and (b) show schematic explanatory views describing an inflection point in an operational state of a piezoelectric/electrostrictive device of the present invention.

More particularly, the reason is that, as shown in FIGS. 2(a) and (b), one end of a piezoelectric/electrostrictive element 2 including a pair of electrodes 2b and 2c and a piezoelectric/electrostrictive layer 2a, and one end of the piezoelectric operating portion 2' exist on the fixing portion 5, and the other end of a piezoelectric/electrostrictive operating portion 2' is extended, to be formed, to at least a part of the thin plate portions 6 and 7, while the ends of the piezoelectric/electrostrictive operating portion 2' of the other end side and of the piezoelectric/electrostrictive layer 2a are formed to be within a range not to exceed the entire length of the thin plate portions 6 and 7, and the Young's modulus Y1 of a material composing the thin plate portions 6 and 7 and the Young's modulus Y2 of a material composing the piezoelectric/electrostrictive layer 2a have a relationship which satisfies the following expression, namely;

$$1 < Y1/Y2 \leq 20.$$

Without saying, whereas examples of FIGS. 2(a) and (b) are in a mode that one end of a piezoelectric/electrostrictive element 2 including a pair of the electrodes 2b and 2c and a piezoelectric/electrostrictive layer 2a and one end of the piezoelectric/electrostrictive operating portion 2' respectively exist on the fixing portion 5, respective ends may also exist on the movable portion 4.

In other words, in the structure described previously, by making the Young's modulus of thin plate portions larger than the Young's modulus of a piezoelectric/electrostrictive layer, a displacement of a piezoelectric/electrostrictive element can be effectively converted into a bending displacement of a driving portion, thus a displacement of a movable portion to be driven by the bending displacement can be made larger, and the movable portion is facilitated to displace substantially in parallel. Contrarily, when the Young's modulus of the thin plate portions is small, not only a displacement of the movable portion is made smaller, but also a flapping component in the Y-axis direction and a displacement component in the Z-axis direction is increased, thus a displacement in the rotational mode is made likely to be generated, thus making it difficult to have a dominant uniaxial displacement in the X-axis direction. On the other hand, if the Young's modulus of the thin plate portions exceeds twenty times of the Young's modulus of the piezoelectric/electrostrictive layer, the thin plate portions again become to be hard to bend, thus generating a phenomenon that a displacement of the movable portion is made smaller, and therefore it is necessary to select composition of a material within the range defined by the above-described expressions.

By the way, it is preferable to structure the above described piezoelectric/electrostrictive device such that the movable portion displaces in a range that an angle θ formed by a side, opposing to the fixing portion, of the movable portion in a displaced state and the same side of the movable portion prior to the displacement satisfies the following expression, namely;

$$0° \leq \theta \leq 0.1°.$$

The displacement of the movable portion in this manner can be obtained not only by employing the above-described structures for respective members, but also by suitably selecting the Young's modulus for the thin plate portions and the Young's modulus for the piezoelectric/electrostrictive layer within a range described previously, thus a larger displacement is obtained.

Figure 3:
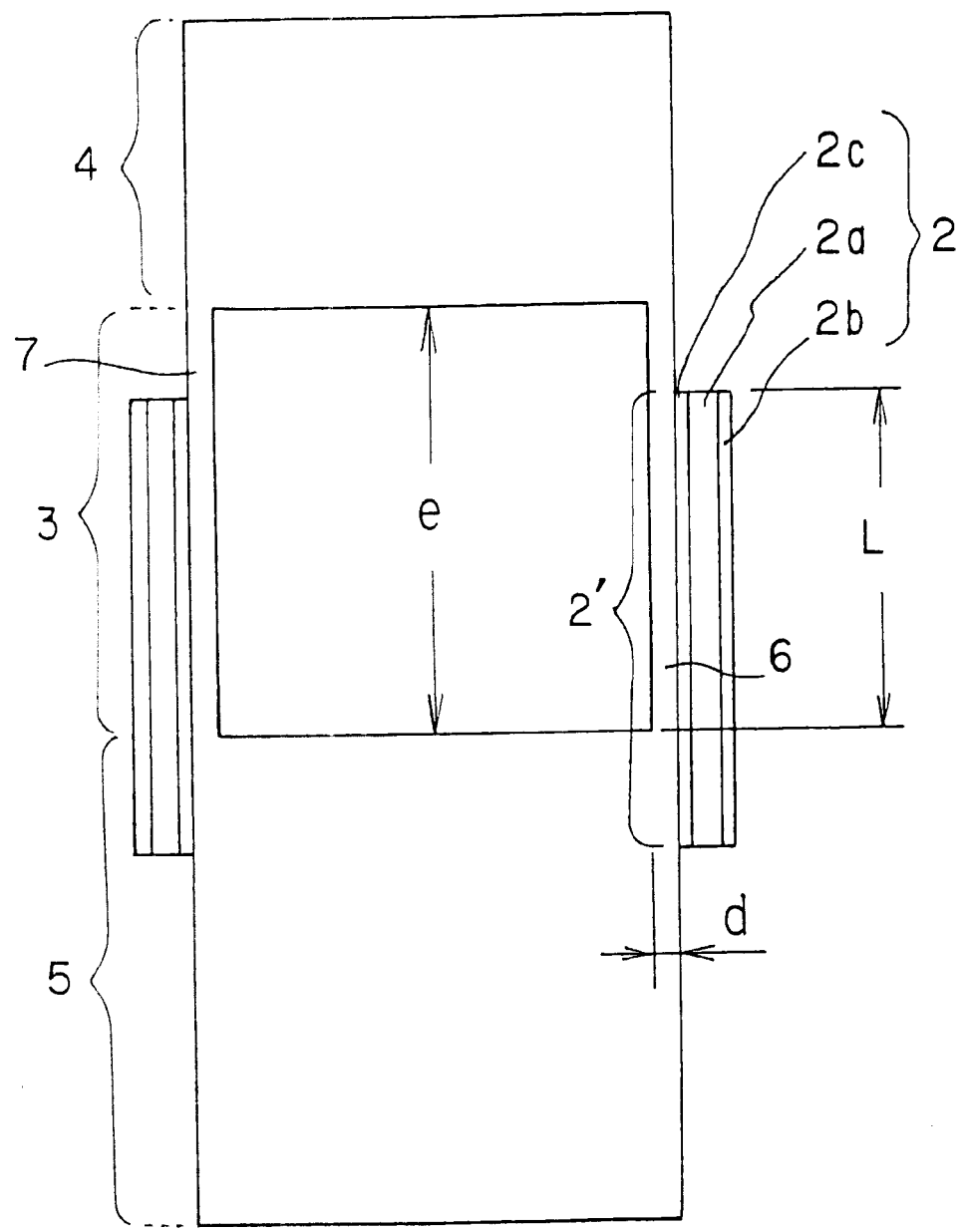
FIG. 3 shows a schematic explanatory view describing a relationship between a length "L" of the portion of a piezoelectric/electrostrictive element arranged on the thin plate portion, a length "e" of the thin plate portion, and a thickness "d" of a thin plate portion, in a structure of a piezoelectric/electrostrictive device of the present invention.

Now, relationship between the length L of the portion of the piezoelectric/electrostrictive operating portion 2' arranged on the thin plate portions 6 and 7, the length e of the thin plate portions 6 and 7, and the thickness d of the thin plate portions 6 and 7, is described with reference to FIG. 3. FIG. 3 is for describing the relationship between the length "L" of a piezoelectric operating portion of the piezoelectric/electrostrictive element 2 arranged on the thin plate portions 6 and 7, the length "e" of the thin plate portions 6 and 7, and the thickness "d" of the thin plate portions 6 and 7. By arranging the length L of a portion, on the thin plate portions 6 and 7, of a piezoelectric/electrostrictive operating portion 2' out of the piezoelectric/electrostrictive element 2, and the thin plate portions 6 and 7 having a specific thickness d and a specific length e so that, out of the piezoelectric/electrostrictive element 2, the length L of the portion of the piezoelectric/electrostrictive operating portion 2' arranged on the thin plate portions 6 and 7, the length e of the thin plate portions 6 and 7, and the thickness d of the thin plate portions 6 and 7 satisfies the following expression, namely;

$$30 \leq (L/e) \times 100 \leq 100 - d/2.5,$$

the movement of the piezoelectric/electrostrictive element 2 can be surely transferred to the thin plate portion 6, and the thin plate portions 6 and 7 are efficiently bent, and as the result, it becomes possible to have the movable portion 4 largely displaced substantially in parallel. Although, in the mode shown in FIG. 3, one end of the piezoelectric/electrostrictive operating portion 2' of the piezoelectric/electrostrictive element 2 is formed on the fixing portion 5, of course, in a device of the present invention, depending on modes of use application, one end of piezoelectric/electrostrictive operating portion 2' of the piezoelectric/electrostrictive element 2 may be formed on the movable portion 4.

A piezoelectric/electrostrictive device having an inflection point of the displacement on the thin plate portion 6, which is one of preferable embodiments of the present invention, is described with reference to FIG. 1. In this embodiment, a device is structured so as to satisfy the above-described expression, namely;

$$30 \leq (L/e) \times 100 \leq 100 - d/2.5,$$

and in a virtual circle having the center thereof on a perpendicular dropped from the middle point of a side, opposing to the fixing portion 5, of the movable portion 4, in a non-displacement state, to the fixing point 5, and passing through the middle point of the movable portion 4 in the non-displacement state and the middle point of the movable portion 4 displaced by operation of the driving portion 3, the movable portion 4 is displaced such that a relationship between the radius r of the virtual circle and the length e of the thin plate portion 6 satisfies the following expression, namely;

$$0 \leq e/r \leq 100,$$

and by so structuring that, when the device is driven by a displacement of the piezoelectric/electrostrictive element 2, on the thin plate portion 6 which is bent so as to displace the movable portion 4, the inflection point of the displacement, for the displacement of the bending mode, exists on the thin plate portion, a substantially parallel as well as large displacement is made obtainable. Specifically, the value of Y1/Y2 is to be selected within the above-described range depending upon the value of (L/e)×100.

In FIG. 1, symbol A denotes the middle point of the movable portion 4 in the X-axis direction in a state a device is not driven, and symbol A' denotes the middle point of the movable portion 4 in the X-axis direction in a state the device is driven. A coordinate of the middle point A of the movable portion 4 in the X-axis direction in a state a device is not driven, and a coordinate of the middle point A' of the movable portion 4 in the X-axis direction when the device is driven at a predetermined voltage are found, a displacement path of the movable portion 4 is approximated to a circle passing the two points of A and A', and on an assumption that the center thereof exists on a perpendicular dropped from the point A of the movable portion 4 to the fixing point in a state where a device is not driven, the radius r of the above-described virtual circle is derived. When the movable portion 4 performs such operation that satisfies the following ratio e/r between the radius r thus derived of the virtual circle and the length e of the thin plate portion 6 in a state where a device is not driven, the ratio e/r being;

$$0 \leq e/r \leq 100,$$

a surface of the tip of the movable portion 4 comes to displace in substantially parallel to a surface of the lower tip of the fixing portion 5, and in a state where a distance between the movable portion 4 and the fixing portion 5 is substantially unchanged even during the displacement. By doing in this manner, a larger displacement can be obtained. The inflection point at this time ordinarily exists on the thin plate portion 6 in the vicinity of the end of piezoelectric/electrostrictive 2' arranged on the thin plate portion 6.

A device of another more preferable embodiment is described with reference to FIG. 3. In this embodiment, the length L of a portion arranged on the thin plate portions 6 and 7 out of the piezoelectric/electrostrictive operating portion 2' is structured such that the relationship between the length e of the thin plate portions 6 and 7 and the thickness d of the thin plate portions 6 and 7 satisfies the following expression; namely $$40 \leq (L/e) \times 100 \leq 100 - d/1.5$$

In other words, in the present embodiment, it is shown that by structuring so as to have the value of (the length L of a portion arranged on the thin plate portions 6 and 7 out of the above-described piezoelectric/electrostrictive operating portion 2'/the length e of the thin plate portions 6 and 7)×100 is 40 or more, in other words, so as to have the length L of the portion arranged on the thin plate portions 6 and 7 out of the piezoelectric/electrostrictive operating portion at least 40% of the length of the thin plate portions 6 and 7, and with regard to the relationship with the thickness d of the thin plate portions 6 and 7, so as to select the thickness d of the thin plate portions 6 and 7 to satisfy≦100−d/1.5, a substantially parallel displacement can be obtained.

FIGS. 2(a) and (b) show a device of still another embodiment. In this embodiment, a device is structured so as to satisfy the above-described expression, namely;

$$40 \leq (L/e) \times 100 \leq 100 - d/1.5,$$

as well as, as to be described hereinafter, to have the inflection point for displacement positioned at a position of the thin plate portions 6 and 7 parted from a joined portion of the fixing portion 5, where the piezoelectric/electrostrictive operating portion 2' exists, or the movable portion 4 and the thin plate portions 6 and 7 by one half or more of the length of the thin plate portions 6 and 7, and in a virtual circle having the center thereof on a perpendicular dropped to the fixing portion 5, from the middle point of one side, opposing the fixing portion 5, of the movable portion 4 in a non-displacement state of the device, and passing through the middle point of the movable portion 4 in the non-displacement state, and the middle point of the movable portion displaced by operation of the driving portion 3, the movable portion 4 is displaced such that a relationship between the radius r of the virtual circle and the length e of the thin plate portions 6 and 7 satisfies the following expression, namely;

ti $0 \leq e/r \leq 20$.

Figure 2B:
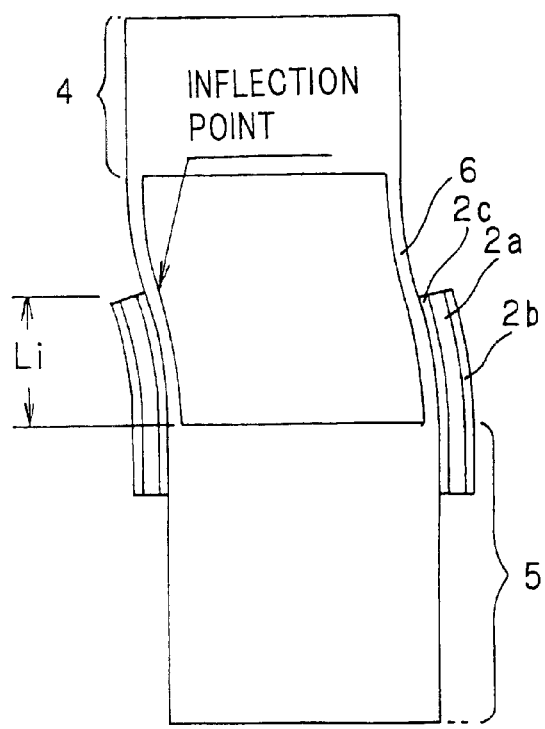
FIG. 2(b) shows a state when displaced, with a symbol "Li" showing the position of the inflection point.

In order to have the operation such that a relationship between the radius r of the virtual circle and the length e of the thin plate portions 6 and 7 satisfies the following expression, namely;

$$0 \leq e/r \leq 20,$$

the value of Y1/Y2 is to be suitably selected within the above-described range depending on the value of (L/e)×100, in order that there exists a relationship which satisfies Li/e≧0.5 between the length of the thin plate portions 6 and 7 indicated by the symbol "e" in FIG. 2(a) and the distance from a joined portion of the thin plate portions 6 and 7 to an inflection point indicated by the symbol "Li" in FIG. 2(b) with the fixing portion 5. By this structure, a larger displacement is made obtainable, while driving force is made stronger, as the structure is advantageous to the displacement, namely having a structure where operation relative to the X-axis is facilitated.

1. Embodiment of the Device

Figure 4:
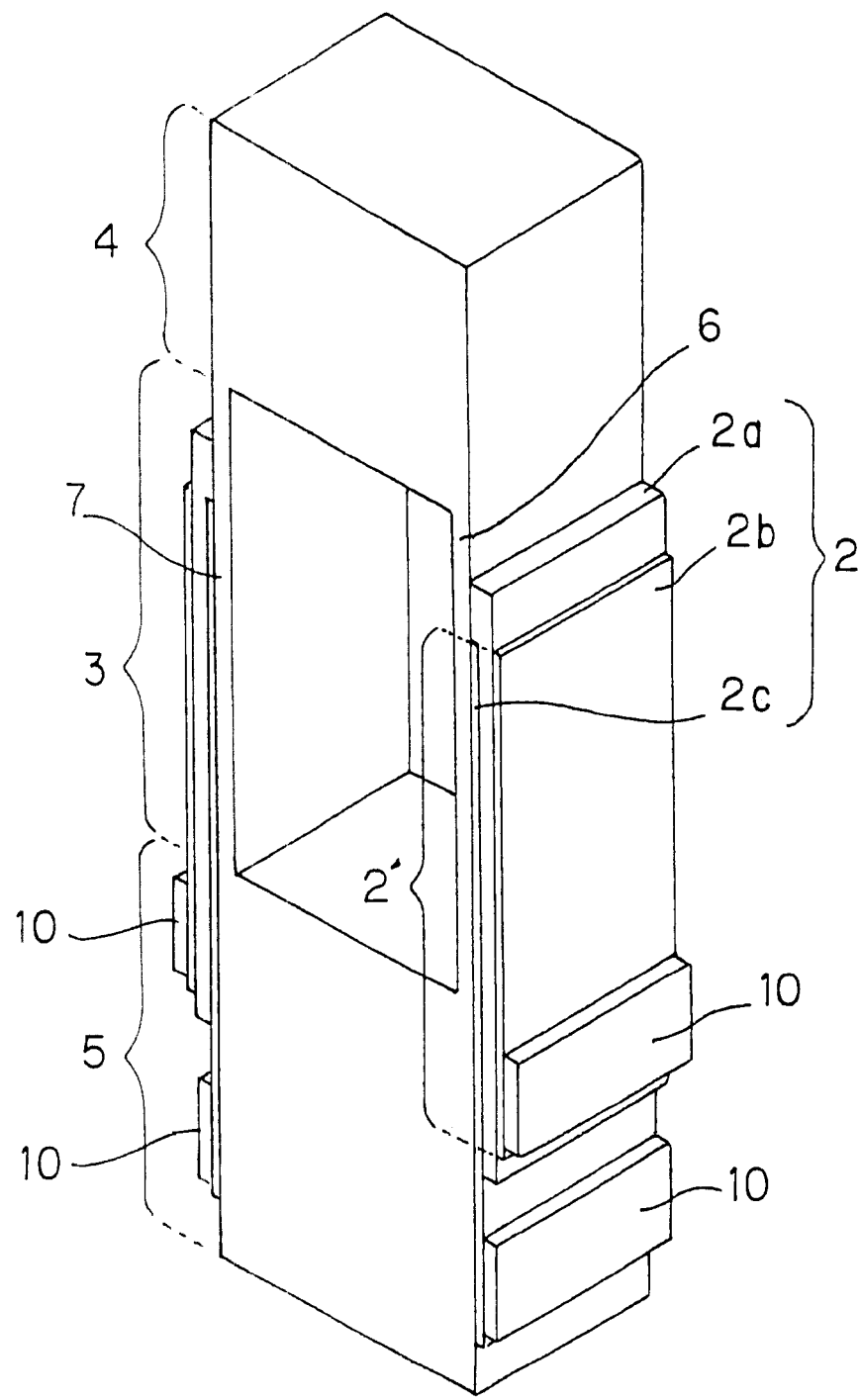
FIG. 4 shows a schematic perspective view of an embodiment of a piezoelectric/electrostrictive device of the present invention.

Now, a representative example of a device according to the present invention is described with reference to FIG. 4 to FIG. 6. A device shown in FIG. 4 is first described. In an embodiment shown in FIG. 4, a first electrode 2c is firstly formed from a position close to an end of the fixing portion 5 toward the movable portion 4, within a range not exceeding the entire length of the thin plate portions 6 and 7, so as to cover the thin plate portions 6 and 7. Then, thereover, a piezoelectric/electrostrictive layer 2a is formed from a position of more or less middle of the fixing portion 5 toward the movable portion 4, within a range not exceeding the entire length of the thin plate portions 6 and 7, so as to completely cover the above-described first electrode 2c. Then, thereover, a second electrode 2b is formed so that one end thereof is positioned close to an end of the piezoelectric/electrostrictive layer 2a formed on the fixing portion 5 and the other end thereof positioned on the thin plate portions 6 and 7 is positioned at the same position as the first electrode 2c. Further, over the first electrode 2c and the second electrode 2b existing on the fixing portion 5, terminal electrodes 10 are respectively formed.

The present device may be constituted by a movable portion 4, a fixing portion 5, and thin plate portions 6, and 7 all of which are made of ceramics or metal or may be a hybrid structure composed of ceramics and metal materials in combination.

There may also be employed a structure wherein portions are joined with a bonding adhesive such as an organic resin and glass, a ceramic unitary structure wherein ceramic green laminate is integrated by firing, or a metallic unitary structure which is integrated by brazing, soldering, eutectic bonding, welding, or the like. It is preferable that the movable portion 4, fixing portion 5 and the thin plate portions 6 and 7 are formed by a ceramic laminated body which is integrated by firing a ceramic green laminated body.

The piezoelectric/electrostrictive element 2, which is independently prepared as mentioned below, is bonded at a predetermined portion of the movable portion 4, the fixing portion 5, and the thin plate portions 6 and 7 by the use of an adhesive such as an organic resin and glass, by brazing, soldering, eutectic bonding, or the like; or formed at predetermined portion of the movable portion 4, the fixing portion 5, and the thin plate portions 6 and 7 by a film-forming method.

Thus fabricated is a device having a structure where one end of a piezoelectric/electrostrictive operating portion 2' comprising a pair of or more electrodes 2b and 2c and a piezoelectric/electrostrictive layer 2a in a direction in which the fixing portion 5 is connected with the movable portion 4 exists on the fixing portion 5, the other end side of the piezoelectric/electrostrictive operating portion 2' is extended, to be formed, to at least a portion of the thin plate portions 6 and 7, and ends of the piezoelectric/electrostrictive operating portion 2' of the other end side and of the piezoelectric/electrostrictive layer 2a are arranged to be within a range not exceeding the entire length of the thin plate portions 6 and 7. By arranging in this manner, a piezoelectric/electrostrictive layer is constituted to be longer than the second electrode 2b, thus a short circuit of the second electrode 2b with the first electrode 2c can be effectively prevented, and connection of terminals with outside leads can be fabricated with higher yield. In this embodiment, an yttrium oxide partially-stabilized zirconia material having the Young's modulus Y1 of 200 GPa is used as a material composing the thin plate portions 6 and 7, lead zirconate-lead titanate-lead magnesium niobate solid solution having the Young's modulus Y2 of 60 GPa is used for a piezoelectric/electrostrictive layer 2a, and the ratio of the both Young's moduli is set to be 3.33 which is the value that satisfies the following expression, namely;

$$1 < Y1/Y2 \leq 20$$

By such structure, the movable portion 4 can be made to displace substantially parallel relative to the fixing portion 5. Further, the angle θ formed by a side, opposing to the fixing portion, of the movable portion in a displaced state and the same side of the movable portion prior to the displacement is found to be 0.05°, the value which satisfies the following expression, namely;

$$0° \leq \theta \leq 0.1°$$

Figure 5:
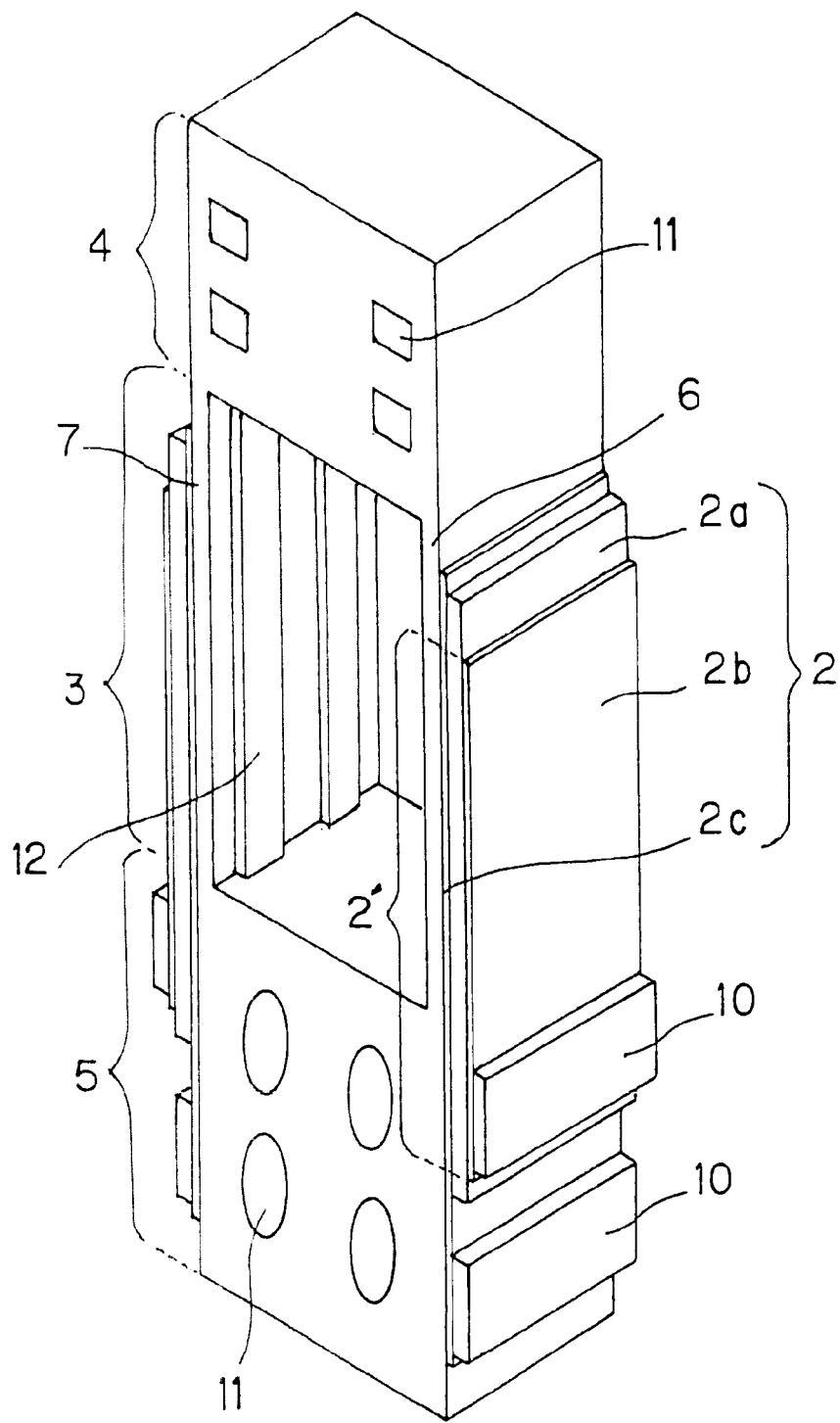
FIG. 5 shows a schematic perspective view of another embodiment of a piezoelectric/electrostrictive device of the present invention.

Moreover, in an embodiment shown in FIG. 5, an example is shown in which a piezoelectric/electrostrictive element has a first electrode 2c formed longer than a piezoelectric/electrostrictive layer 2a and a second electrode 2b, namely formed closer to the movable portion 4. By this structure, in the embodiment, different from the embodiment shown in FIG. 4, a portion where a piezoelectric/electrostrictive layer 2a directly touches the thin plate portions 6 and 7 ceases to exist, and the piezoelectric/electrostrictive layer 2a is made to be joined with the thin plate portions 6 and 7 via a first electrode 2c, which is preferable from a viewpoint of adhesive property. An end of a piezoelectric/electrostrictive operating portion 2' comprising a pair of electrodes 2b and 2c and a piezoelectric/electrostrictive layer 2a is formed to be positioned at around 75% distance, from a joined portion of the fixing portion 5 with the thin plate portions 6 and 7, relative to the length of the thin plate portions 6 and 7. Of course, the Young's modulus Y1 of a material of the thin plate portions 6 and 7, and the Young's modulus Y2 of a material for the piezoelectric/electrostrictive layer 2a are respectively selected to satisfy the following expression, namely;

$$1 < Y1/Y2 \leq 20$$

Further, in this example, terminals 11 for connecting with electric circuits or the like of the outside are formed on the movable portion 4 and the fixing portion 5. Consequently, a variety of sensors, a magnetic head, a slider mounted with a magnetic head or the like can be directly mounted on the movable portion 4 without use of a lead. The terminals 11 of the fixing portion 5 have continuity with respective terminals 11 of the movable portion 4 through wiring 12 formed on the surfaces opposite to the surfaces of the thin plate portions 6 and 7 where the piezoelectric/electrostrictive elements 2 are arranged and inner wiring of the movable portion 4 and the fixing portion 5 so as to be mutually one to one.

By forming, for example, a device shown in FIG. 5 such that the length L (not shown) of a portion arranged on the thin plate portions 6 and 7 out of the piezoelectric/electrostrictive operating portion 2', relative to a relationship between the length e of the thin plate portions 6 and 7 and the thickness d of the thin plate portions 6 and 7, satisfies the following expression, namely;

$$30 \leq (L/e) \times 100 \leq 100 - d/2.5$$

operation of the piezoelectric/electrostrictive element 2 can be reliably transferred to the thin plate portions 6 and 7, and can have the thin plate portions 6 and 7 efficiently bent, and as the result, a piezoelectric/electrostrictive device, capable of largely displacing the movable portion 4 substantially in parallel, can be can be provided.

It should be noted that, in the above described embodiment, by structuring the device such that an inflection point for a displacement exists on the thin plate portion 6, when the device is driven by the displacement of the piezoelectric/electrostrictive element 2, and such that the movable portion 4 displaces so that a relationship between the radius r of the virtual circle and the length e of the thin plate portion 6 satisfies the following expression, in a virtual circle having the center thereof on a perpendicular dropped to the fixing portion 5 from the middle point of a side, opposing to the fixing portion 5, of the movable portion 4 in non-displacement state, and passing through the middle point of the movable portion 4 in the non-displacement state and the middle point of the movable portion 4 displaced by operation of the driving portion 3, the expression being;

$$0 \leq e/r \leq 100,$$

a piezoelectric/electrostrictive device capable of largely displacing the movable portion 4 more effectively and substantially in parallel can be obtained. And in order to ensure the displacement mode, the value of Y1/Y2 may be suitably selected within the range described above, depending on the value of (L/e)×100.

By this structure, while increasing the driving force, an advantageous structure for the displacement, namely a structure facilitating a movement relative to the X-axis is obtained, thus a larger displacement can be obtained. In a device structured to have such a relationship, the thin plate portions have a portion where stiffness, which is determined by a specified length and by the ratio of the Young's moduli Y1/Y2, is relatively low. And when the movable portion is displaced by the displacement of a piezoelectric/ electrostrictive element, the portion where the stiffness, which is determined by the length and the material property thereof, is low makes the deformation of the thin plate portions to be unique, enabling the movable portion to displace substantially in parallel and in larger magnitude.

Moreover, if the length L of a portion arranged on the thin plate portions 6 and 7 out of the piezoelectric/electrostrictive operating portion 2', the length e of the thin plate portions 6 and 7, and the thickness d of the thin plate portions 6 and 7 are selected so as to satisfy the following expression, namely;

$$40 \leq (L/e) \times 100 \leq 100 - d/1.5,$$

specifically, in a virtual circle, having the center thereof on a perpendicular dropped to the fixing portion 5 from the middle point of a side, opposing the fixing point 5, of the movable portion 4 in non-displacement state, and passing through the middle point of the movable portion 4 in the non-displacement state and the middle point of the movable portion 4 displaced by operation of the driving portion 3, the movable portion 4 displaces such that a relationship between the radius r of the virtual circle and the length e of the thin plate portions 6 and 7 satisfies the following expression, namely;

$$0 \leq e/r \leq 20,$$

and the value Y1/Y2 is suitably selected within the above-described range depending on the value of (L/e)×100, so that an inflection point of a displacement exists at a position on the thin plate portions 6 and 7 parted by one half or more of the length of the thin plate portions 6,7 from a joined portion, with the thin plate portions 6 and 7, of the fixing portion 5 or the movable portion 4 to the thin plate portions 6 and 7; the piezoelectric/electrostrictive operating portion 2' existing on either a position of the fixing portion or the movable portion, thus the movable portion 4 can be displaced substantially in parallel and in larger magnitude.

Figure 6:
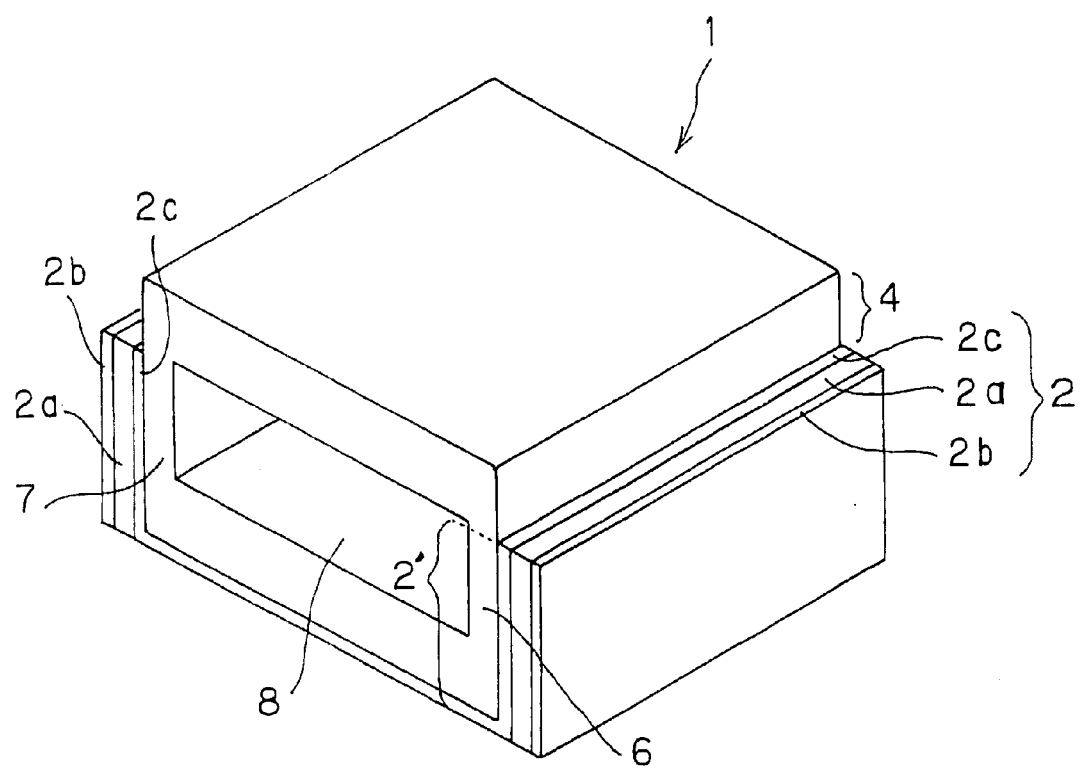
FIG. 6 shows a schematic perspective view of still another embodiment of a piezoelectric/electrostrictive device of the present invention.

An embodiment shown in FIG. 6 shows an example where the lengths of the movable portion 4 and the fixing portion 5 are made shorter, and the widths of the thin plate portions 6 and 7 are made equivalent with the thickness of the device. According to the embodiment, the bottom surfaces and the upper surfaces, which are substantially square, of the fixing portion 5 and the movable portion 4 are made to be surfaces for bonding with the substrate and other members, and the surfaces for bonding are made to be mutually displaced substantially in parallel. By utilizing such an embodiment, one may have a wider area for bonding, or one may preferably use it, as a part for hard disks, for a mechanism in a precise positioning of heads by installing a suspension mounted with a slider on the movable portion 4 side, and installing a carriage arm on the fixing portion 5 side.

In other words, as the fixing portion 5 and the movable portion 4 can be moved as if in sheared shape, the structure is that can utilize a larger displacement, in comparison with a case where a displacement is operated by use of the d15 shear mode of a piezoelectric material bulk. In implementing such a device according to FIG. 6, it is preferable to have a ratio e/a of the thickness a of the hole 8 and the length e of the thin the thin plate portions 6 and 7 at 0.1 to 2, and a ratio a/b of the thickness a of the hole 8 and the width b of the thin plate portions 6 and 7 at 0.05 to 2. The defined value of the e/a is important in increasing the paralleling degree of mutual displacements of the above-described bonding surfaces, while the defined value of the a/b is important in increasing a driving force of the driving portion 3 and displacement components in a direction of a specific axis, in this case the X-axis.

Figure 7A:
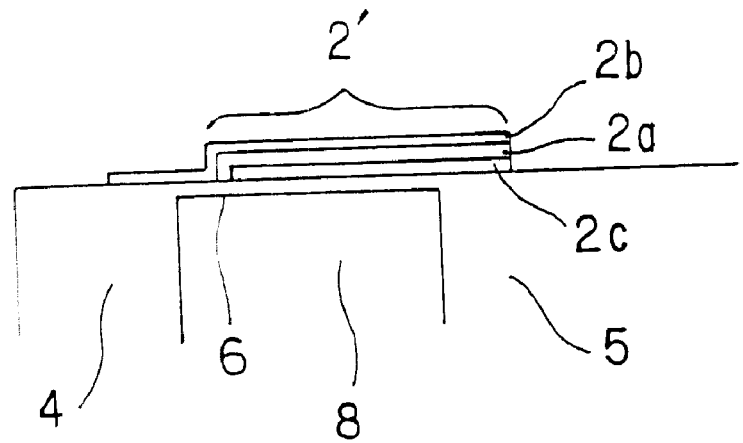
FIGS. 7(a), (b), and (c) show schematic explanatory views describing an arrangement of piezoelectric/electrostrictive elements used in a piezoelectric/electrostrictive device of the present invention.

FIGS. 7(a), (b), and (c) show explanatory views of a structure of a piezoelectric/electrostrictive operating portion 2', and therefore, in the drawings, out of a pair of thin plate portions 6 and 7, only a thin plate portion 6 having at least a piezoelectric/electrostrictive element 2 formed thereon is shown. FIGS. 7(a), (b), and (c) show exemplary views showing mutual relationship between a second electrode 2b, a first electrode 2c, and a piezoelectric/electrostrictive layer 2a respectively constituting a piezoelectric/electrostrictive operating portion 2' according to the present invention. FIG. 7(a) exemplarily shows an embodiment where the second electrode 2b is arranged in a direction from the fixing portion 5 side toward the movable portion 4 exceeding the entire length of the thin plate portion 6, and is formed as if to cover the piezoelectric/electrostrictive layer 2a and the first electrode 2c, however, the piezoelectric/electrostrictive layer 2a and the first electrode 2c are arranged respectively with a desired distance from the movable portion 4, thus the other end of the piezoelectric/electrostrictive layer 2a of the piezoelectric/electrostrictive element 2 is arranged lest it should covers the entire length of the thin plate portion 6. In other words, in this embodiment, the other end of the piezoelectric/electrostrictive operating portion 2' comprising a pair of electrodes 2b and 2c and a piezoelectric/electrostrictive layer 2a is arranged to be a desired position on the thin plate portion 6.

Figure 7B:
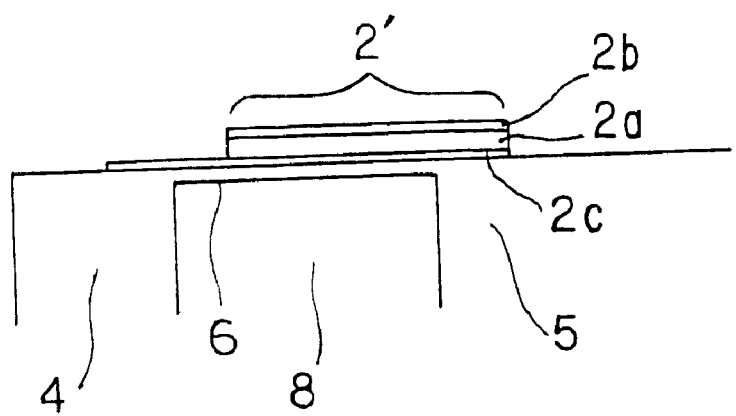
Figure 7C:
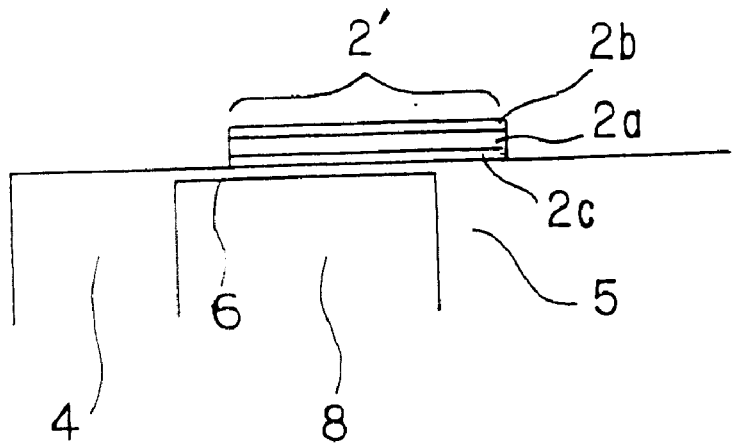

FIG. 7(b) shows an embodiment in an exemplary view where a first electrode 2c is arranged extending from the fixing portion 5 side to a part of the movable portion 4 covering the entire length of the thin plate portion 6, while having a piezoelectric/electrostrictive layer 2a and a second electrode 2b arranged thereon with a desired distance from the movable portion 4 and in the same length, and also in the embodiment, the other end of the piezoelectric/ electrostrictive layer 2a of the piezoelectric/electrostrictive element 2 exists on the thin plate portion 6 and is arranged lest the entire length of thin plate portion 6 should be covered. FIG. 7(c) shows an embodiment where a first electrode 2c and a second electrode 2b are arranged in the same length interposing a piezoelectric/electrostrictive 2a, and also in the embodiment, the other end of the piezoelectric/electrostrictive layer 2a of a piezoelectric/electrostrictive element 2 exists on the thin plate portion 6, and is arranged lest the entire length of the thin plate portion 6 should be covered. Of course, the other end of the piezoelectric/electrostrictive operating portion 2' comprising a pair of electrodes 2b and 2c and a piezoelectric/electrostrictive layer 2a is arranged with a desired distance from the movable portion 4. In the present invention, the other end of the piezoelectric/electrostrictive operating portion 2' comprising a pair of electrodes 2b and 2c and the piezoelectric/electrostrictive layer 2a is arranged with a desired distance from the movable portion 4 so as to be arranged at a desired position on the thin plate portion 6, with the other end of the piezoelectric/electrostrictive layer 2a arranged also on the thin plate portion 6. Of course, mutual positional relationship of the second electrode 2b, a piezoelectric/electrostrictive layer 2a, and the first electrode 2c can take a variety of modes so long as the above-described requirements are met.

As can be apparent from the above description, it is preferable to constitute a piezoelectric/electrostrictive element so that a desired part of a driving portion 3 can display enough flexibility. In order to secure enough flexibility which permits a movable portion 4 to drive "substantially in parallel", it is necessary that at least the arrangement of the piezoelectric/electrostrictive element arranged on the thin plate portion 6 is to be made the structure as described above, and a material composing the thin plate portion 6 of which Young's modulus being Y1 and a material composing the piezoelectric/electrostrictive layer 2a of which Young's modulus being Y2 are to be selected so as to satisfy the following expression, namely;

$$1 < Y1/Y2 < 20.$$

To achieve this target, it is necessary to pay enough consideration to the balance of the thickness of the above-described three members, and the thickness is preferably 2 to 100 μm for the thin plate portions 6 and 7, 0.1 to 50 μm for the electrodes 2b and 2c, and 3 to 300 μm for the piezoelectric/electrostrictive layer 2a.

Figure 8:
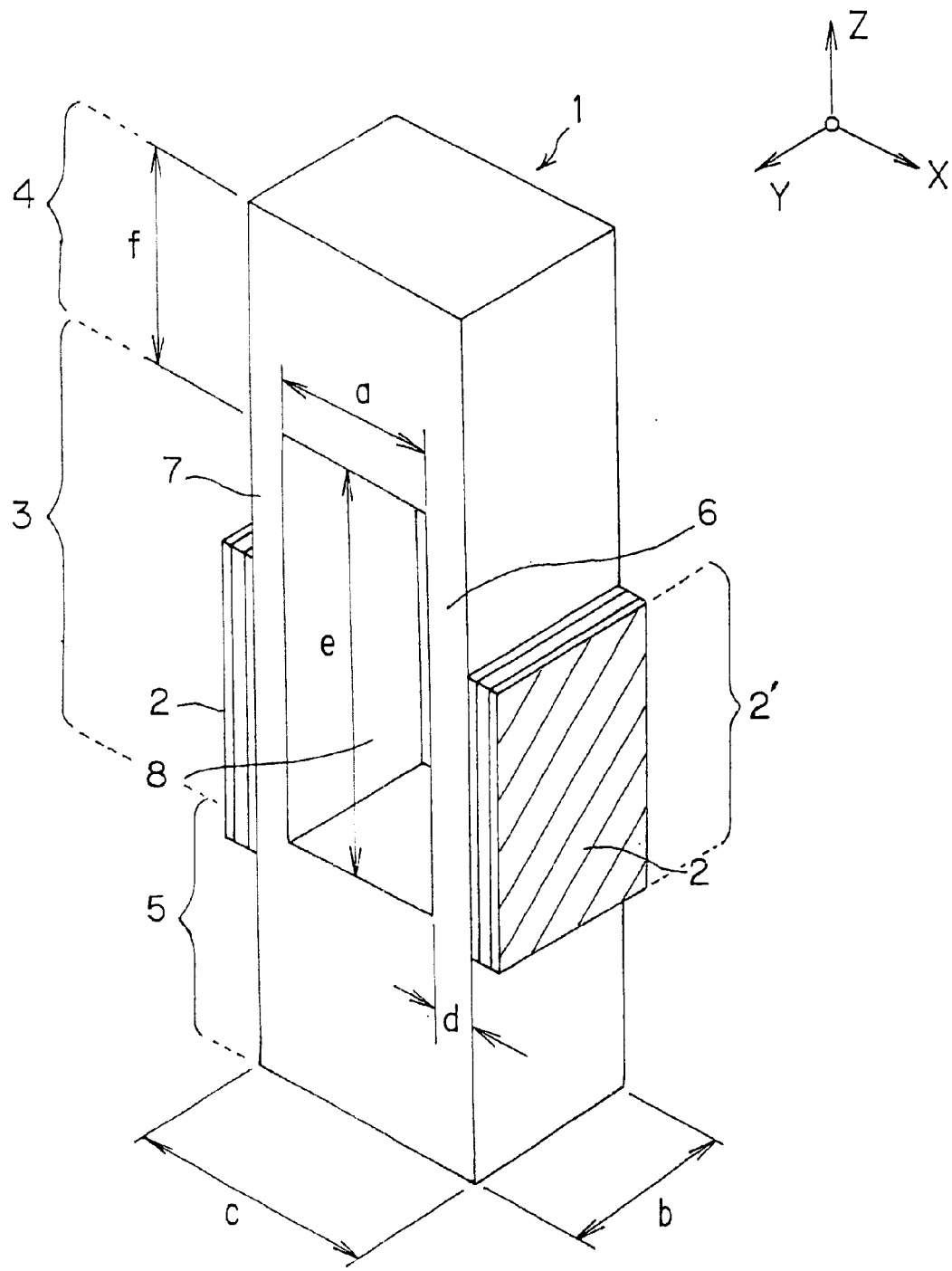
FIG. 8 shows a schematic perspective view describing a mutual relationship between respective members of a piezoelectric/electrostrictive device of the present invention.

Although partially overlapping, FIG. 8 shows a schematic explanatory view for describing mutual relationship of respective members of a device according to the present invention. A device 1 comprises respective members of a driving portion 3 to be driven by a displacement of a piezoelectric/electrostrictive element 2, a movable portion 4 to be displaced based on the drive of the driving portion 3, and a fixing portion 5 for holding the driving portion 3 and the movable portion 4. The driving portion 3 comprises a pair of mutually opposing thin plate portions 6 and 7, and a film-like piezoelectric/electrostrictive element 2 formed on the outer surfaces of the thin plate portions 6 and 7, the fixing portion 5 and the movable portion 4 are combined via the driving portion 3, a piezoelectric/electrostrictive operating portions 2' exists on portions of the thin plate portions 6 and 7 and the fixing portion 5, and a hole 8 is formed by inner walls of the driving portion, an inner wall of the movable portion, and an inner wall of the fixing portion. In such a structure where the piezoelectric/electrostrictive operating portion 2' extends over the fixing portion 5, a displacement mode of the driving portion 3 takes a bending displacement mode in which the thin plate portions face toward the outer space, as shown in FIGS. 28 (*a*) and (*b*), thus the device can have a feature of having the displacement mechanism to largely displace the movable portion 4. In order to ensure the displacement mode, it is preferable that the distance the piezoelectric/electrostrictive operating portion 2' extends over the fixing portion 5 or the movable portion 4 is made to be one half or more of the thickness d of the thin plate.

Then, the device is, relative the thickness of the hole 8, namely a distance a in the X-axis direction in the drawing, and the width of the thin plate portion, namely a distance b in the Y-axis direction in the drawing, is structured to have the ratio a/b at 0.5 to 20. Preferably, the ratio a/b is 1 to 10, and more preferably 2 to 8. The defined value of the a/b is based on a finding that a displacement of a piezoelectric/ electrostrictive device according to the present application can be made larger and a displacement in the X-Z plane in the drawing can be dominantly obtained.

On the other hand, relative to the length of the thin plate portions 6 and 7, namely a distance e in the Z-axis direction in the drawing and the thickness a of the above-described hole 8, the ratio e/a is preferably 0.5 to 10, and more preferably 0.7 to 5.

The defined value of the e/a is based on a finding that a piezoelectric/electrostrictive device according to the present application can generate a high displacement at high resonant frequency, namely in a high speed of response. Accordingly, from comprehensive viewpoint of generated displacement quantity, displacement mode, and responsibility, if the a/b is set at 0.5 to 20, and the e/a is set within 0.5 to 10, more preferably the a/b at 1 to 10, and the e/a within 0.7 to 5, there is attained actually a device capable of showing a large displacement with relatively low driving voltage and showing suppressed flapped displacement or suppressed vibrations in the Y-axis direction, and having superior in high speed responsibility. This is extremely preferable.

In a device according to FIG. 6, where the hole 8 has the thickness a and the thin plate portions 6 and 7 have the length e, it is preferable to have the ratio e/a at 0.1 to 2, where the hole 8 has the thickness a and the thin plate portions 6 and 7 have the width b, it is preferable to have the ratio a/b at 0.05 to 2. The defined value of the e/a has an important meaning in increasing the above-described paralleling degree of the displacement of the joined surfaces, and in increasing resonant frequency, without remarkably decreasing the displacement, while the defined value of the a/b has an important meaning in increasing driving force of the driving portion 3, and in increasing displacement components toward. a specific axis of the movable portion 4, for example, in this case, increasing displacement components in the X-axis direction. In a piezoelectric/electrostrictive device according to the present invention, the hole 8 may be filled with a gel material, for example, silicone gel.

The length f of a movable portion 4 shown in FIG. 8 is preferably shorter. By shortening, lightening of the weight and increase in resonant frequency can be realized. However, in order to secure stiffness of the movable portion 4 toward the X-axis direction, and to ensure the displacement, the ratio f/d relative to the thickness d of the thin plate portions is set to be 3 or more, and preferably 10 or more. Actual dimensions of respective members are determined considering a bonding area for mounting members on the movable portion 4, a bonding area for mounting the fixing portion 5 on another member, a bonding area for mounting electrode terminals and the like, mechanical strength and durability of the device as the entirety, required displacement and resonant frequency, driving voltage, and the like. Ordinarily, a is preferably to be 100 to 2000 μm, and more preferably 200 to 1000 μm. Ordinarily, b is preferably to be 50 to 2000 μm, and more preferably 100 to 500 μm. Ordinarily, d is, relative to the width b of the thin plate portions 6, 7, made to be b>d, in order that a flapped displacement or a displacement component in the Y-axis direction can be effectively suppressed, and is preferably to be 2 to 100 μm, and more preferably 4 to 60 μm.

Ordinarily, e is preferably to be 200 to 3000 μm, and more preferably 300 to 2000 μm. And ordinarily, f is preferably 50 to 2000 μm, and more preferably 100 to 1000 μm. It should be noted that by structuring in this manner, the ratio of the displacement in the Y-axis direction relative to the displacement in the X-axis or the major axis direction ordinarily does not exceed 10%, however, a low voltage driving can be facilitated by suitably adjusting within a range of the above-mentioned suitable dimension ratios and the actual dimensions, and the displacement component in the Y-axis can be adjusted to be 5% or less, which is an extremely advantageous effect. In other words, a substantially dominant displacement for the X-axis, or the major axis is made obtainable. Resultantly, a piezoelectric/electrostrictive device which is superior in high speed responsibility, and capable of generating a large displacement with relatively low voltage, in addition to the above-described features, can be obtained. Moreover, if a device is structured to follow the structure shown in FIG. 6, though a displacement is relatively smaller, a displacement component toward the Y-axis can become adjustable even to 3% or less.

Furthermore, in a device 1, the shape of the device is, instead of board-like body as shown in FIG. 27 as a conventional example, three dimensional solid shape, for example rectangular, for the movable portion 4 and the fixing portion 5, and as the thin plate portions 6 and 7 are straddled so as to have the sides of the movable portion 4 and the fixing portion 5 to be continuous, the stiffness in the Y-axis direction of the device can be selectively increased. In other words, in the device. 1, the operation of the movable portion 4 only in a plane including the driving direction of the driving portion 3, namely in the X-Z plane, can be selectively generated, and the operation of the movable portion 4 in the Y-Z plane, namely the operation in the so-called flapping direction can be suppressed.

A shape of the hole 8 to be formed by inner walls of the driving portion 3, an inner wall of the movable portion 4, and an inner wall of the fixing portion can be optional so long as there is no obstruction caused to the operation of the driving portion. In other words, a sectional view of the hole 8 may be other than rectangular, such as circular, elliptical, trapezoid, parallelogram, or the like.

Figure 9:
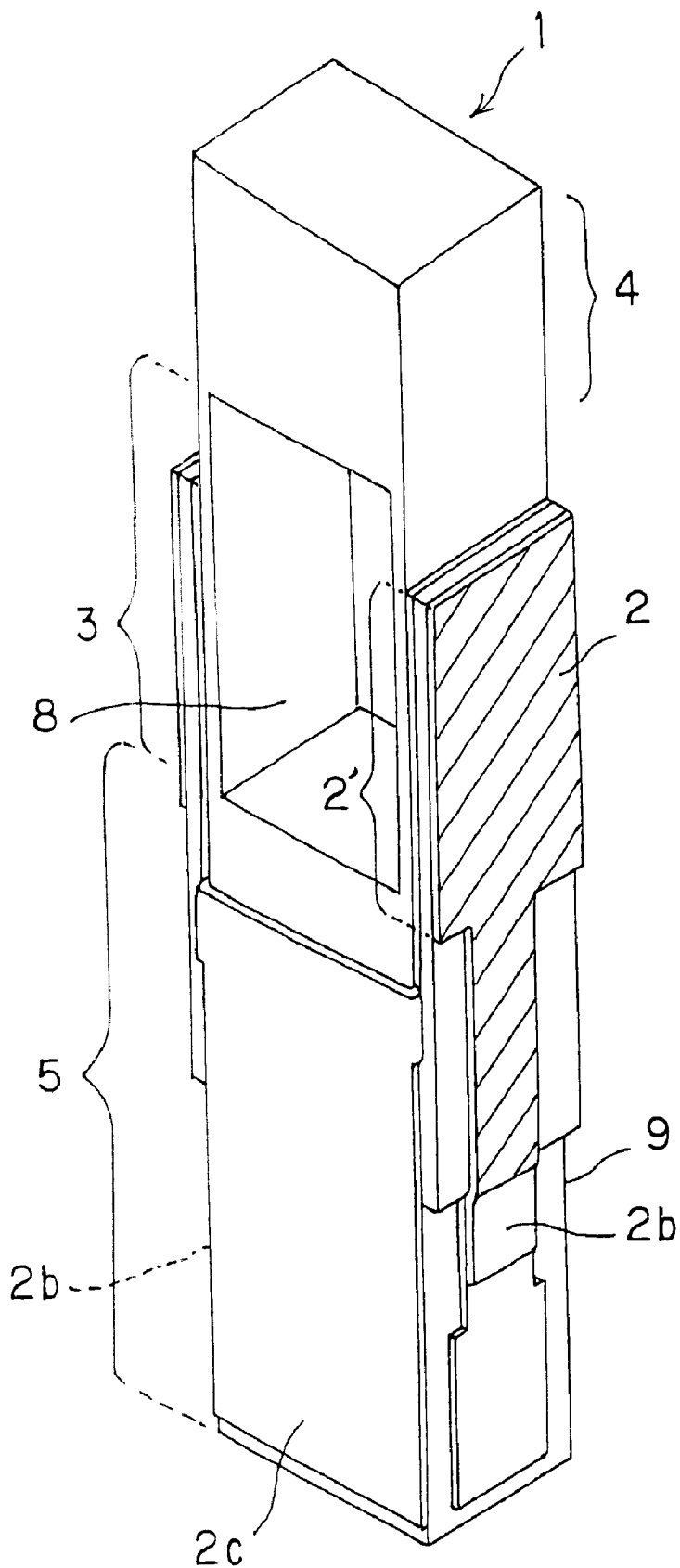
FIG. 9 shows a schematic perspective view of still another embodiment of a piezoelectric/electrostrictive device of the present invention.

Now, another embodiment of a piezoelectric/electrostrictive device according to the present invention is described. FIG. 9 shows a device having one each piezoelectric/electrostrictive element 2 on both plate portions of the pair of thin plate portions 6 and 7, first electrodes 2c of two piezoelectric/electrostrictive elements 2 are made for common use, and are drawn out from the fixing portion 5 side of one of the surfaces where the hole 8 is apertured, and second electrodes 2b are directly drawn out to the fixing portion 5 side of surfaces where respective piezoelectric/electrostrictive elements are formed. Though, as shown in FIG. 4 to FIG. 6, and FIG. 8 and FIG. 9, apiezoelectric/electrostrictive element 2 formed at least a part of the outer surface of at least one of thin plate portions 6 or 7 of the thin plate portions 6 and 7, has a width the same as the width of thin plate portions 6 and 7, of course, one narrower than the width of the thin plate portions 6 and 7 may be used. However, the width of the piezoelectric/electrostrictive element 2 is preferably to be the same as the width of the thin plate portions 6 and 7, as this serves to increase the driving force of the driving portion 3, and to favorably act on the higher displacement.

Figure 10:
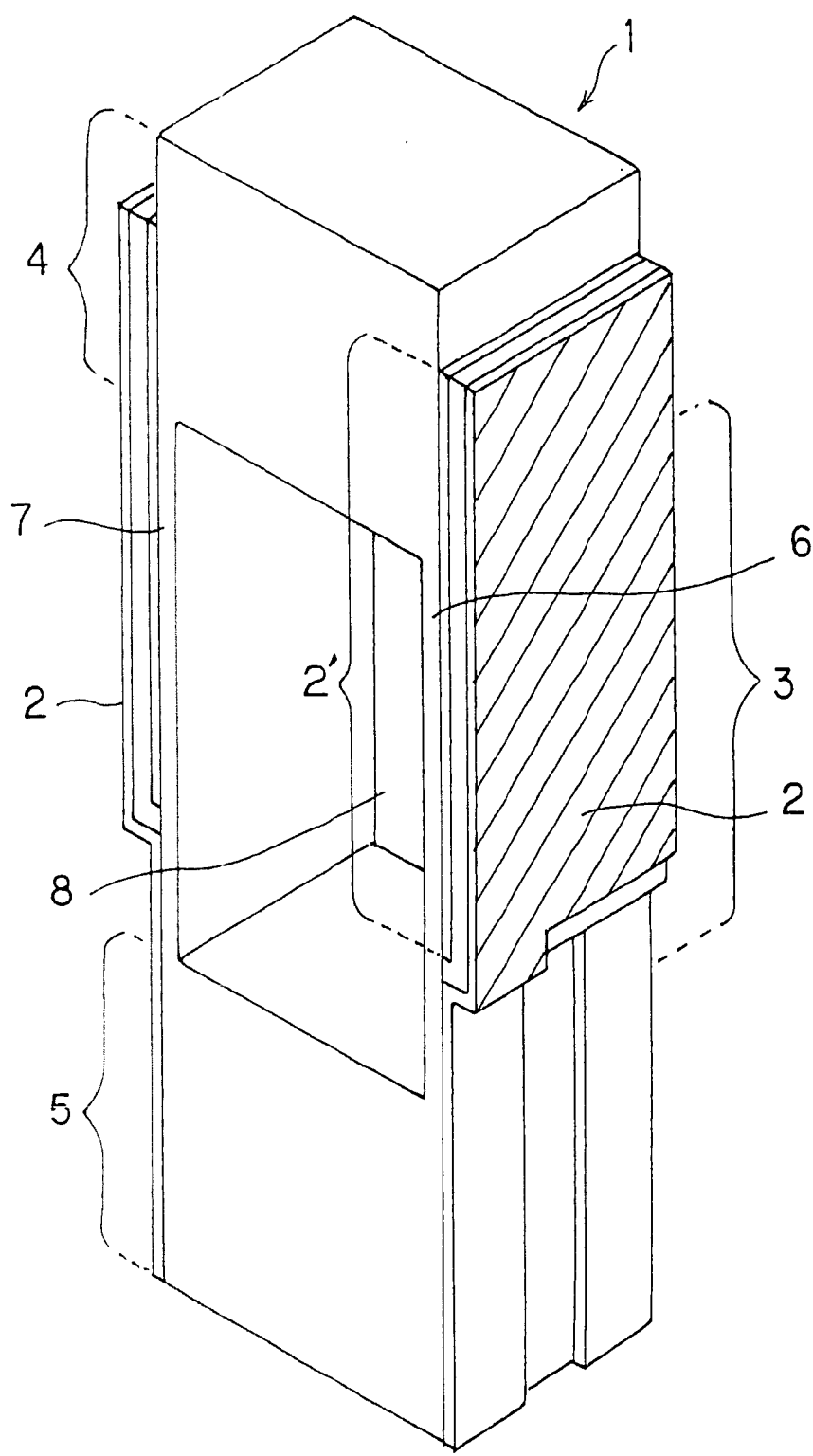
FIG. 10 shows a schematic perspective view of still another embodiment of a piezoelectric/electrostrictive device of the present invention.
Figure 11:
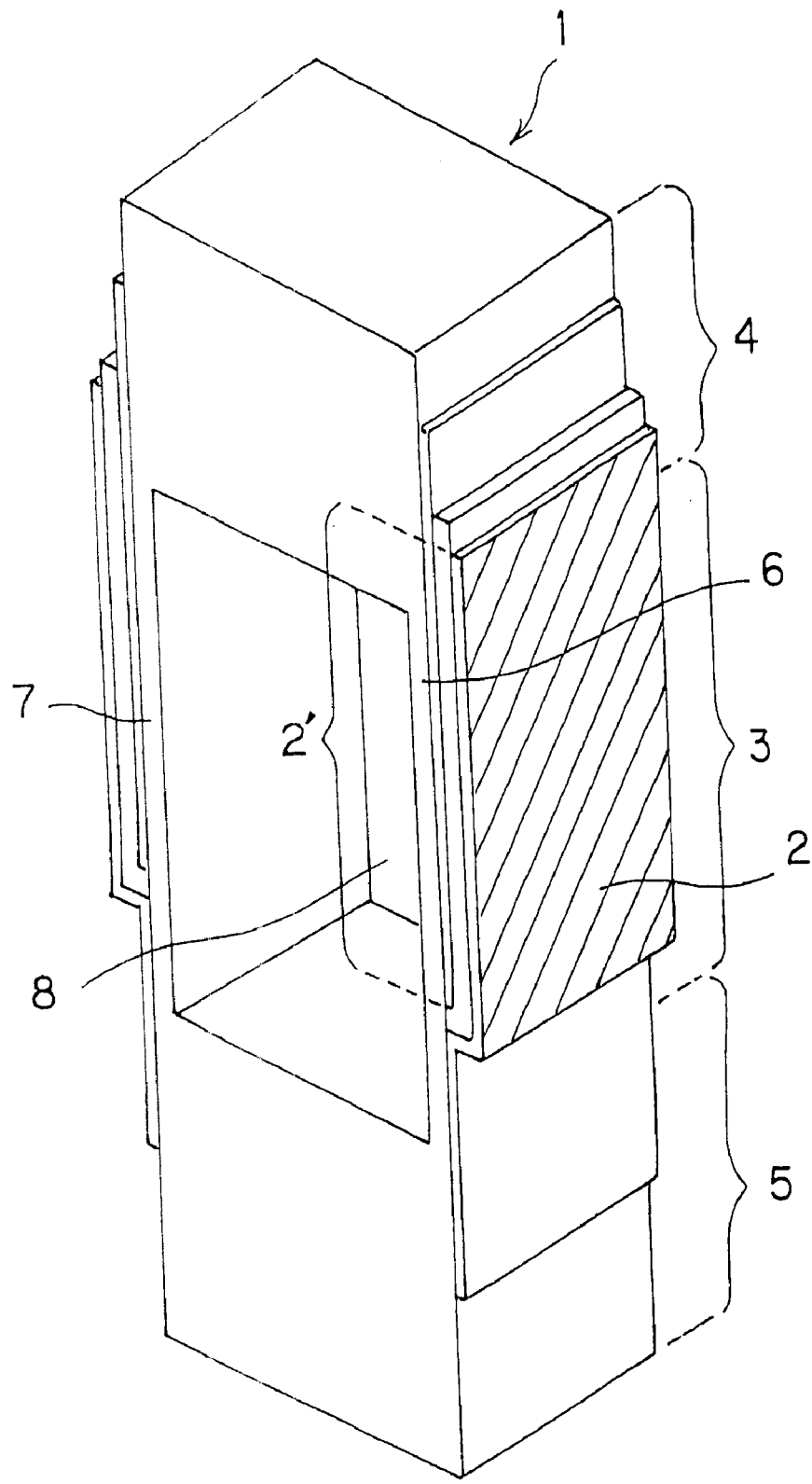
FIG. 11 shows a schematic perspective view of still another embodiment of a piezoelectric/electrostrictive device of the present invention.

FIG. 10 and FIG. 11 show, different from the above-described FIG. 9, examples where one end of a piezoelectric/electrostrictive operating portion 2' comprising a pair of electrodes and a piezoelectric/electrostrictive layer is arranged on a movable portion 4, the other end of the piezoelectric/electrostrictive operating portion 2' is extended, to be formed, to at least a part of the thin plate portions 6 and 7, and ends of the piezoelectric/electrostrictive operating portion 2' and a piezoelectric/electrostrictive layer on the other end side are formed within a range not exceeding the entire length of the thin plate portions 6 and 7. In other words, in FIG. 9, the piezoelectric/electrostrictive operating portion 2' is formed in a mode extending to the thin plate portions 6 and 7 and the fixing portion 5, while in FIG. 10 and FIG. 11, the piezoelectric/electrostrictive operating portion 2' is formed contrarily in a mode extending to the thin plate portions 6 and 7 and the movable portion 4. In FIG. 10 and FIG. 11, in the same way as in FIG. 9, the width of the piezoelectric/electrostrictive element 2 is also made to be the same as the width of the thin plate portions 6 and 7, thus the same effect can be obtained as the device shown in FIG. 9, and in addition, the movable portion 4 per se can be displaced basically in the same way as the device shown in FIG. 9.

Figure 12:
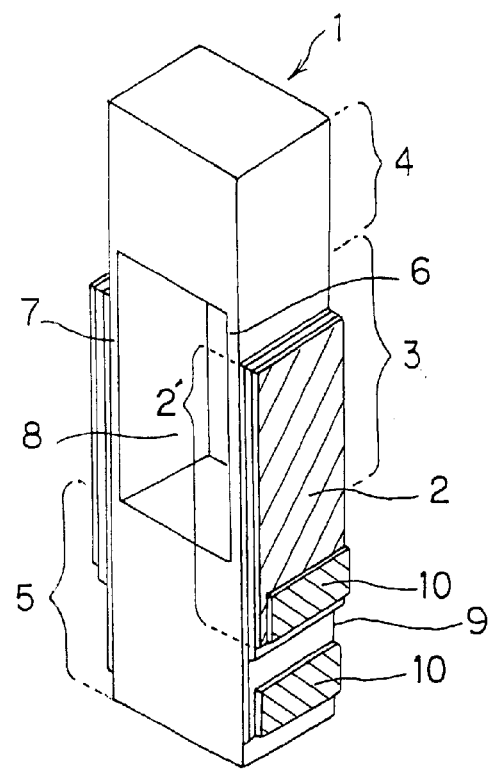
FIG. 12 shows a schematic perspective view of still another embodiment of a piezoelectric/electrostrictive device of the present invention.
Figure 13:
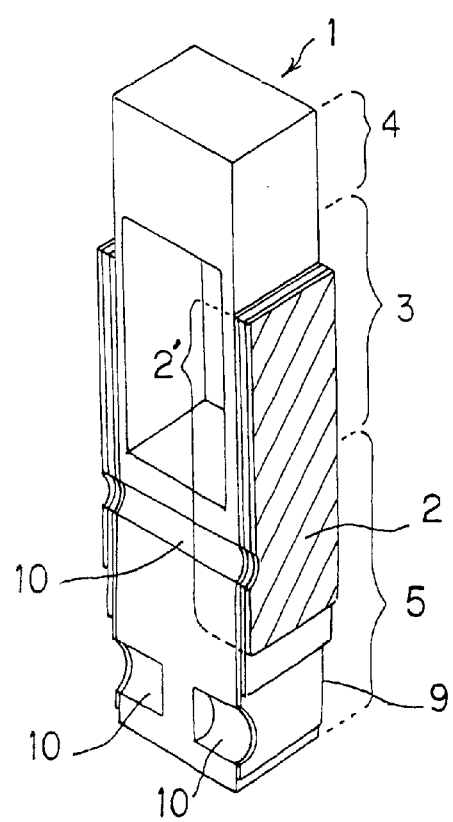
FIG. 13 shows a schematic perspective view of still another embodiment of a piezoelectric/electrostrictive device of the present invention.

Now, arrangement of driving signal applying terminals shown in FIG. 12 and FIG. 13 is described. Respectively in both examples, one end of a piezoelectric/electrostrictive operating portion 2' comprising a pair of electrodes and a piezoelectric/electrostrictive layer 2a exists on a fixing portion 5, the other end side of the piezoelectric/electrostrictive layer 2' is extended, to be formed, at least to a part of the thin plate portions 6 and 7, and ends of a piezoelectric/electrostrictive operating portion 2' and piezoelectric/electrostrictive layers of the other end side exist on the thin plate portions 6 and 7, and are formed to be in a range not exceeding the entire length thereof. FIG. 12 shows an example where the driving signal applying terminals 10 are arranged on a side of the fixing plate 5, namely on the same surface as a surface where the piezoelectric/electrostrictive element 2 is formed, basically similarly with the case shown in FIG. 4. According to the structure, a device can be fixed independently of the surface where the terminals are arranged, and as the result, high reliability can be attained for fixing of the device and bonding between circuits and terminals.

It should be noted, in the embodiment, that terminals and circuits are bonded by means of the flexible print circuit (also called FPC), the flexible flat cable (also called FFC), the wire bonding, or the like. FIG. 13 shows driving signal applying terminals 10 arranged on a surface which orthogonally crosses a surface where a piezoelectric/electrostrictive element 2 is arranged. If the surface where the driving signal applying terminals 10 are formed is utilized as a fixing surface, connecting of the driving signal applying terminals 10 with circuits (not shown) and fixing of the device per se can be simultaneously performed, which is an advantage in facilitating compaction of an apparatus per se. Of course, a device may be fixed on an opposite surface 9 which is unformed of the driving signal applying terminals. In this embodiment, through-holes are formed in advance on the fixing portion 5, and after the through-holes are filled with a conductive material, a pattern of the piezoelectric/electrostrictive element 2 is formed so as to have respective electrodes bonded with the through-holes, and then the filled surfaces of the through-holes are exposed by machining, thus the surfaces are utilized as the driving signal applying terminals 10. As the conductive material, a lead may be embedded. In this example, a through-hole provided in the vicinity of the hole 8 is used as a common terminal.

In addition to the above-described advantages, a device of the present invention has an advantage that, as for members except for a piezoelectric/electrostrictive element 2, a suitable composing material can be selected depending on the required properties of respective members, as the entirety is not necessarily required to be composed of a piezoelectric/electrostrictive material. In other words, by composing the members except for the piezoelectric/electrostrictive element 2 with a material of lighter weight, the device can be made to be scarcely influenced by harmful vibrations in operation, and in the similar manner, improvement in the mechanical strength, handling property, impact resistance, and humidity resistance can be facilitated.

Further, as the use of a filler is not required, the efficiency of the displacement due to the inverse piezoelectric effect and the electrostrictive effect is never deteriorated. 2. Constituting Elements of the Device Now, though partially repeating the description so far made, respective members constituting a device of the present invention is individually and specifically described with an example of the device 1 shown in FIG. 8.

(1) Movable Portion and Fixing Portion

A movable portion 4 is a portion to be operated based on the driving quantity of the driving portion 3, and a variety of members are mounted thereon depending on application uses. For example, when a device 1 is used as a displacement element, members requiring positioning are mounted, such as a shield for an optical shutter, a magnetic head, a slider with a magnetic head mounted thereon, a suspension with a slider mounted thereon, or the like, for positioning a hard disk or ringing suppression mechanism.

A fixing portion 5 is a portion for holding the driving portion 3 and the movable portion 4, and by holding and securing the fixing portion5 to any substrate, for example, a carriage arm fixed to a VCM (voice coil motor), either a fixing plate or a suspension fixed to said carriage arm, and the like, when utilizing it for positioning the above-described hard disk, the device 1 as an entirety is secured.

Further, electrode leads or other members may also be arranged in order to control a piezoelectric/electrostrictive element 2. As a material composing the movable portion 4 and the fixing portion 5, there is no limitation so long as stiffness exists therein, however, a ceramic, to which the ceramic green sheet laminating method, to be hereinafter described, is applicable, can be preferably used. The ceramic includes a material, particularly, containing zirconia, such as fully-stabilized zirconia, partially-stabilized zirconia, or the like, alumina, magnesia, silicon nitride, aluminum nitride, or titanium oxide as the major component, and in addition thereto, a material containing mixture thereof as the major component may also be used, however, in points of high mechanical strength and high toughness, zirconia, specifically a material containing fully-stabilized zirconia as the major component or a material containing partially-stabilized zirconia as the major component is preferable. The major component means a component contained in a material in 50 or more mass (weight) %. Further, instead of the ceramics, it may be composed of a metal or an engineering plastic. As far as such a material has a stiffness, any material may be used irrespective of the sort of the material. For example, steel material such as stainless steel, and non-ferrous material such as nickel may be illustrated as a metal.

(2) Driving Portion

A driving portion 3 is a portion to be driven by a displacement of a piezoelectric/electrostrictive element 2, comprising mutually opposing thin plate portions 6 and 7, and a film-like piezoelectric/electrostrictive element 2 formed on the surface of the thin plate portions 6 and 7.

① Thin Plate Portions

Thin plate portions 6 and 7 are thin-plate-like members having flexibility, and have a function of amplifying an expanding or contracting displacement of a piezoelectric/electrostrictive element 2 arranged on the surface thereof into a bending displacement, to transmit to a movable portion 4.

Accordingly, a figure or a material of the thin plate portions 6 and 7 is sufficed if a material composing the thin plate portions having the Young's modulus Y1 and a material composing the piezoelectric/electrostrictive layer having the Young's modulus Y2 have a relationship therebetween that satisfies the following expression, namely;

$$1 < Y1/Y2 \leq 20,$$

have flexibility as a matter of course, and have mechanical strength in an order of being unbreakable by a bending deformation, and the materials can be suitably selected from a ceramic, a metal, or the like, similarly with the above-described movable portion and fixing portion, within a range that satisfies the relationship of the Young's moduli, considering responsibility and operability of the movable portion.

For example, in the case of being composed of metal materials, any metallic material may be employed as long as the material has flexibility and is capable of bending deformation as mentioned above. However, it is preferable to be composed of any kind of stainless steel or any kind of spring steel as a ferrous material, and beryllium copper, phosphor bronze, nickel, or nickel-iron alloy as a non-ferrous material.

Ordinarily, the thickness of the thin plate portions 6 and 7 is preferably around 2 to 100 $\mu$m, combined thickness of the thin plate portion 6 or 7 and a piezoelectric/electrostrictive element 2 is preferably 7 to 500 $\mu$m. Further, in the structure of a device according to the present invention, in order to further improve targeted effects, the thickness of electrodes 2b and 2c are preferably made to be 0.1 to 50 $\mu$m, and the thickness of a piezoelectric/electrostrictive layer 2a is preferably made to be 3 to 300 $\mu$m, considering the above-described relationship between the Young's modulus of the material of the thin plate portions and the Young's modulus of the material of piezoelectric/electrostrictive layer. Further, the width of the thin plate portions 6 and 7 is preferably 50 to 2000 $\mu$m. As a material composing the thin plate portions 6 and 7, a ceramic similar to the same used for the movable portion 4 and the fixing portion 5 can be preferably used, and zirconia, specifically a material containing fully-stabilized zirconia as the major component or a material containing partially-stabilized zirconia as the major component can be most preferably employed because of its high mechanical strength when made into a thin body, high toughness, and small reactivity with a piezoelectric/electrostrictive layer or an electrode material. As for fully-stabilized or partially-stabilized zirconia, preferable is the same stabilized in the following way. Although zirconia can be partially or fully stabilized by adding or containing at least any one of oxides such as yttrium oxide, ytterbium oxide, cerium oxide, calcium oxide, and magnesium oxide, targeted stabilization of zirconia is possible not only by adding one kind out of the above listed compounds, but also by adding combination of the compounds.

It should be noted that a load of respective compounds is 1 to 30 mol % (mole percent), preferably 1.5 to 10 mol % for yttrium oxide or ytterbium oxide, 6 to 50 mol %, preferably 8 to 20 mol % for cerium oxide, 5 to 40 mol %, preferably 5 to 20 mol % for calcium oxide or magnesium oxide, and among these, specifically preferable for the stabilizer is yttrium oxide, and in the case, the load is preferably 1.5 to 10 mol %, and more preferably 2 to 4 mol %. Further, as a co-sintering agent or the like, alumina, silica, magnesia, transition metal oxide, or the like can also be added within a range of 0.05 to 20 wt % (weight percent), however, when the sintering integration by the film forming method is employed as the formation method of a piezoelectric/electrostrictive element, alumina, magnesia, transition metal oxide, or the like may be preferably added as an additive.

In order that the above-described mechanical strength and the stabilized crystal phase may be obtained, it is preferable to have zirconia having a mean crystal grain diameter of 0.05 to 3 $\mu$m. preferably 0.05 to 1 $\mu$m or less. As for the thin plate portions 6 and 7, as described previously, a ceramic, similar to the same used for the movable portion and the fixing portion, may be used, however, it is preferable to compose using substantially the same material in view of improved reliability of the joined portions, higher mechanical strength of the device, and reduction of the complication in fabrication.

② Piezoelectric/Electrostrictive Element

Figure 14:
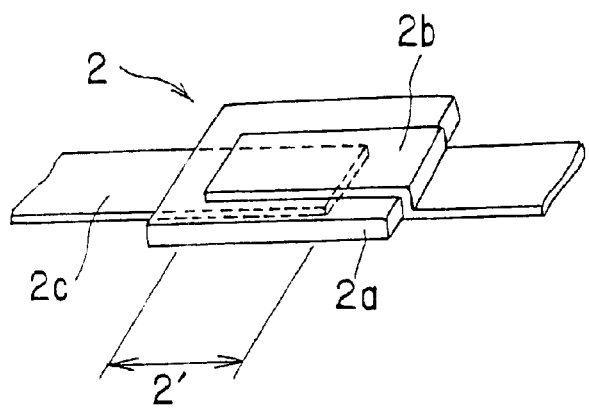
FIG. 14 shows a schematic perspective view of an embodiment of a piezoelectric/electrostrictive element constituting a piezoelectric/electrostrictive device of the present invention.

A piezoelectric/electrostrictive element 2 at least comprises a piezoelectric/electrostrictive layer and a pair of or more electrodes for applying a voltage to the piezoelectric/electrostrictive layer. Although a conventionally known piezoelectric/electrostrictive element 2 of unimorph-type, bimorph-type, or the like may be used, it is preferable to constitute a device described in the present application with a piezoelectric/electrostrictive element 2 of unimorph-type, as the unimorph-type is superior in stability of the displacement quantity to be generated, and advantageous in lightening the weight thereof. For example, as shown in FIG. 14, a laminated-type piezoelectric/electrostrictive element 2 or the like having a first electrode 2c, a piezoelectric/electrostrictive layer 2a, and a second electrode 2b laminated in layers can be preferably used. When a piezoelectric material such as ferroelectric substance or the like is ordinarily used for a piezoelectric/electrostrictive layer, if a voltage is applied across the aboved-described electrodes (for example, between the second electrode 2b and the first electrode 2c ) to cause an electric field to operate on the piezoelectric/electrostrictive layer 2, based on the electric field, an electric field induced distortion is induced to the piezoelectric/electrostrictive layer 2, and a piezoelectric/electrostrictive element described in FIG. 14 has a function, as a lateral effect of the electric field induced distortion, of mainly generating a distortion in the contracting mode in a direction parallel to the main surface of the piezoelectric/electrostrictive layer 2. Accordingly, if the piezoelectric/electrostrictive element 2 of the structure is applied to a device of the present invention, the above-described distortion which contracts in a direction of the main surface described previously is converted into a bending displacement for bending the thin plate portions 6 and 7, and the driving portion 3 is bent and displaced having the joined portion of the thin plate portions 6 and 7 with the movable portion 4 or of the thin plate portions 6 and 7 with the fixing portion 5 as the fulcrums in a direction toward the outer space (opposite direction of the hole), and as the result, the movable portion can be displaced in a predetermined direction.

Further, a piezoelectric/electrostrictive element 2 may also be preferably structured such that, in addition to the structure where the piezoelectric/electrostrictive layer 2a is interposed by a pair of upper and lower electrodes, a piezoelectric/electrostrictive layer 2a is further formed on the second electrode, a third electrode is further formed on the piezoelectric/electrostrictive layer 2a, thus having two layers of piezoelectric/electrostrictive operating portion 2'. Furthermore, it is also preferable to have a structure in that electrodes 2b and 2c, and a piezoelectric/electrostrictive layer 2a are repeatedly laminated, thus having the piezoelectric/electrostrictive operating portions in three layers, four layers, five layers, or even more. By thus making the piezoelectric/electrostrictive operating portions 2' in multi-layered structure, driving force of the driving portion can be increased, a displacement can be made larger, stiffness of the device per se can be increased, thus realizing higher resonant frequency and high speed responsibility. Moreover, in a structure where stiffness of the device per se is increased, for example, in a structure where thickness of the thin plate portions is thickened, a larger displacement and higher resonant frequency can be facilitated with ease.

Figure 24:
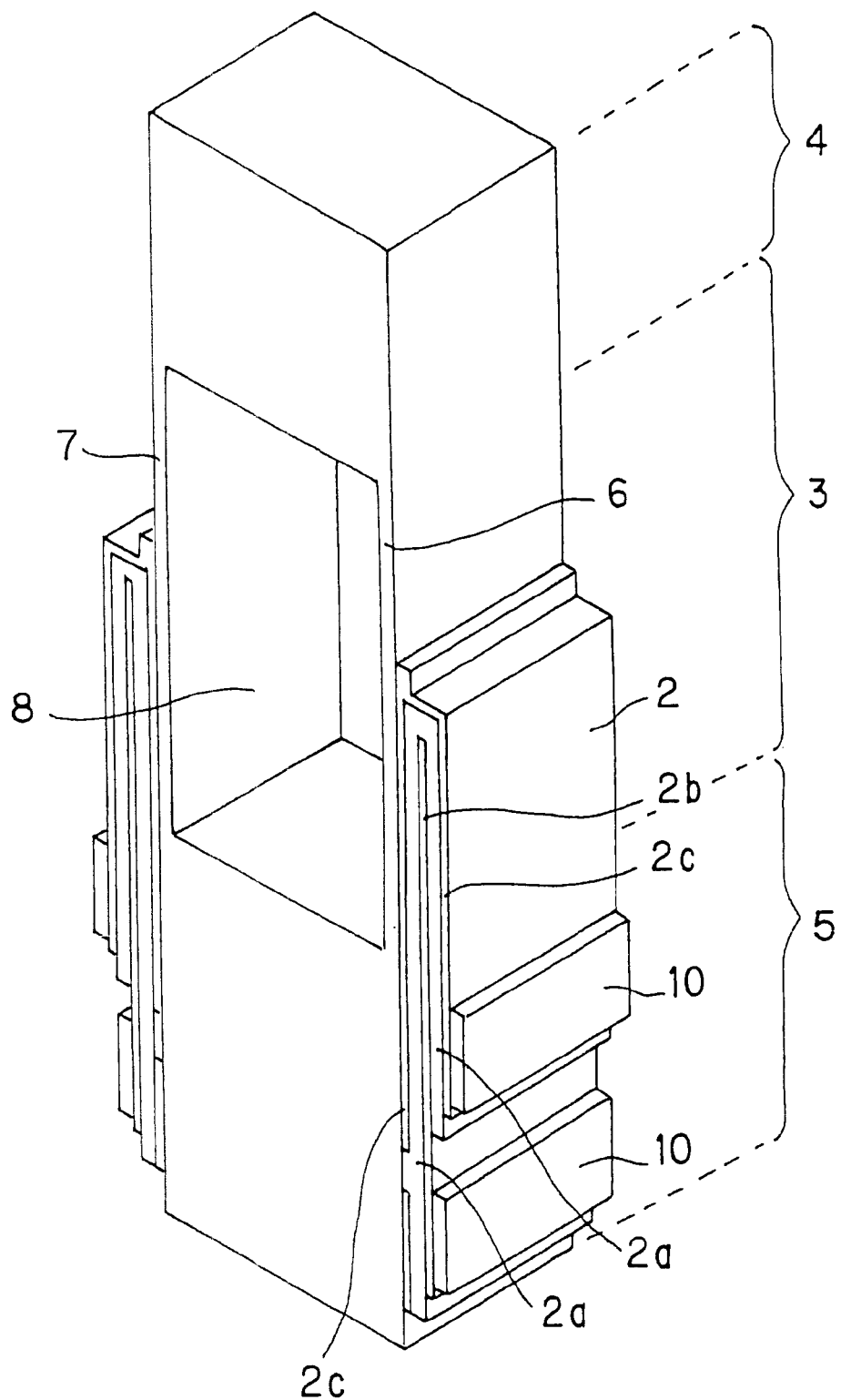
FIG. 24 shows a schematic perspective view of still another embodiment of a piezoelectric/electrostrictive device of the present invention.

For example, a piezoelectric/electrostrictive element 2 shown in FIG. 24 has piezoelectric/electrostrictive operating portions 2' in two layers. Respective piezoelectric/electrostrictive elements 2 have the element structure shown in FIG. 14, where a first electrode 2c, a piezoelectric/electrostrictive layer 2a, a second electrode 2b, a piezoelectric/electrostrictive layer 2a, and a first electrode 2c are sequentially laminated, and the piezoelectric/electrostrictive operating portion comprising a pair of electrodes 2b and 2c and a piezoelectric/electrostrictive 2a are formed in two layers in a laminating direction of the composing films of the element. Further, electrodes in the same element and denoted by the same symbol are respectively applied by a voltage of the same potential, and terminals for causing an electric current to flow to respective electrode are all formed on a surface of the fixing portion 5 where elements are formed. Furthermore, though the device shown in FIG. 24 shows an embodiment where a first electrode 2c is made for common use by a piezoelectric/electrostrictive operating portion of the first layer and a piezoelectric/electrostrictive operating portion of the second layer, these maybe, of course, independent electrode structure. Naturally, one end of the piezoelectric/electrostrictive operating portion exists on the fixing portion 5, and the other end is arranged on the thin plate portions 6 and 7, and other end of the piezoelectric/electrostrictive layer 2a exists on the thin plate portions 6 and 7, and is arranged to be within a range not exceeding the entire length of the thin plate portions. A piezoelectric/electrostrictive element 2 shown in FIG. 25 has a piezoelectric/electrostrictive operating portion in three layers. More in detail, a first electrode 2c, a piezoelectric/electrostrictive layer 2a, a second electrode 2b, a piezoelectric/electrostrictive layer 2a, a first electrode 2c, a piezoelectric/electrostrictive layer 2a, a second electrode 2b are sequentially laminated, and a piezoelectric/electrostrictive operating portion comprising a pair of electrodes and a piezoelectric/electrostrictive layer is provided in three layers in a direction in which composing films of the element are laminated to be formed.

In the similar way with the device shown in FIG. 24, electrodes in the same element and denoted by the same symbol are respectively applied with voltages of the same potential, and terminals causing an electric current to flow to respective electrodes are all formed on a surface of the fixing plate 5 where elements are formed. Similarly with the device shown in FIG. 24, in the present embodiment as well, though a first electrode 2c and a second electrode 2b are respectively made to be shared and for common use by piezoelectric/electrostrictive operating portions of the first layer, the second layer, and the third layer, the electrodes may be respectively arranged independently. In this case, respective electrodes are called in sequence from the one closest to the thin plate portions 6 and 7, first, second, third, and fourth electrode. As to leading about of electrodes for a multi-layered piezoelectric/electrostrictive operating portions, as the devices shown in FIG. 24, and FIG. 25, electrodes that can be made for common use are to be made for common use so as to reduce the number of terminals, which is a structure advantageous in driving and fabrication. On the other hand, when all electrodes are independently provided, respective piezoelectric/electrostrictive operating portions can be operated by separate signals, enabling more precise displacement control, which is an advantage. Of course, one end of a piezoelectric/electrostrictive operating portion exists on the fixing portion 5, the other end thereof is arranged on the thin plate portions 6 and 7, and the other end of the piezoelectric/electrostrictive layer 2a also exists on the thin plate portions 6 and 7, and are arranged to be within a range not exceeding the entire length of the thin plate portions.

With increase of the number of layers, driving force can be increased, however, power consumption also increases therewith, and in actual implementation, the number of the layers or the like may be suitably determined depending on application uses and specification of a device. Furthermore, in a device according to the present invention, as apparent from embodiments shown in drawings, even if the driving force is increased by proving a multi-layered piezoelectric/ electrostrictive operating portion, basically, a distance of the thin plate portions 6 and 7 in width direction is unchanged, and therefore, the device is extremely preferable in positioning of a magnetic head for a hard disk and in applying for a control device for ringing suppression or the like, for example, in a extremely narrow gap.

Figure 29:
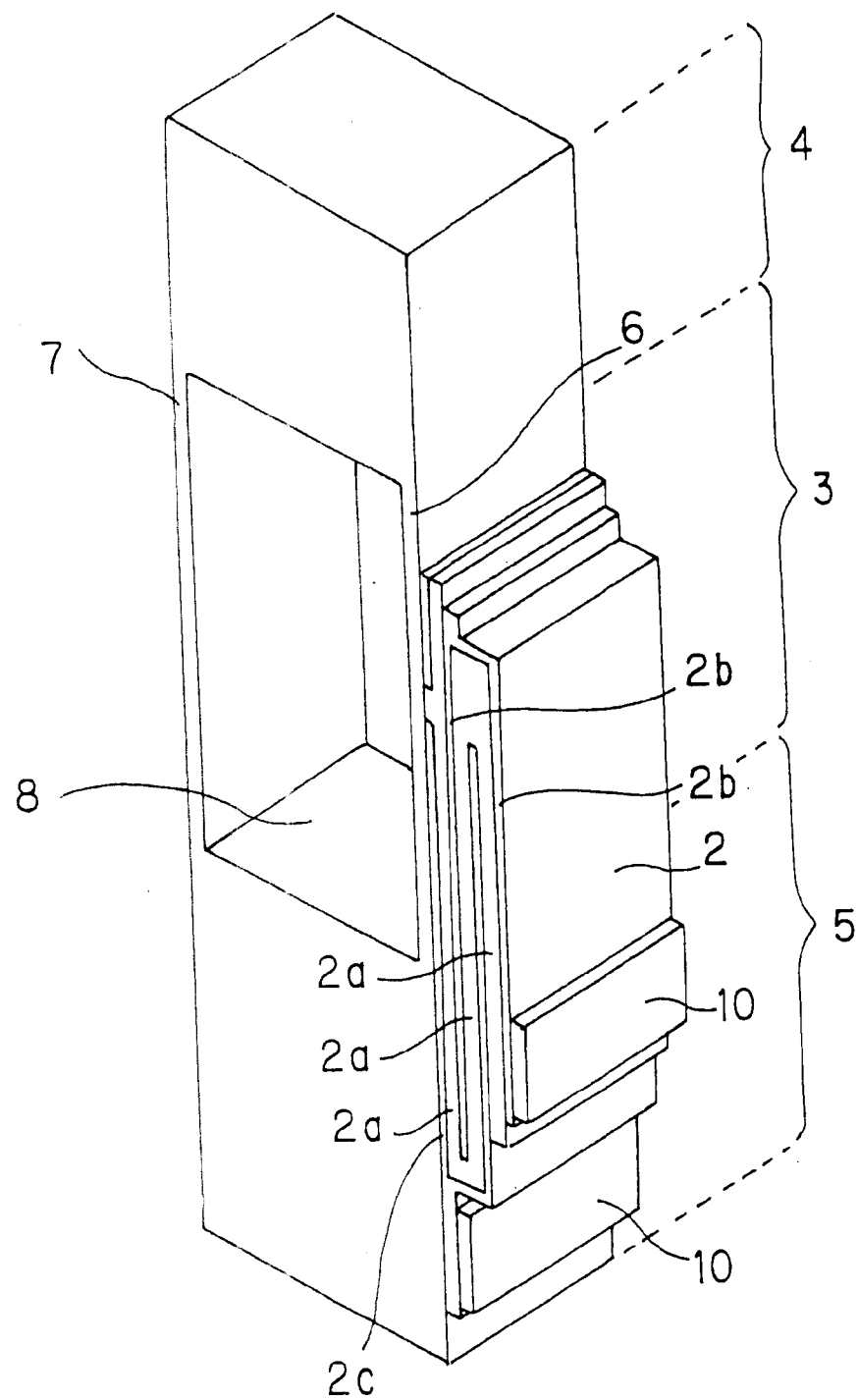
FIG. 29 is a schematic perspective view showing still another embodiment of a piezoelectric/electrostrictive device of the present invention.
Figure 30:
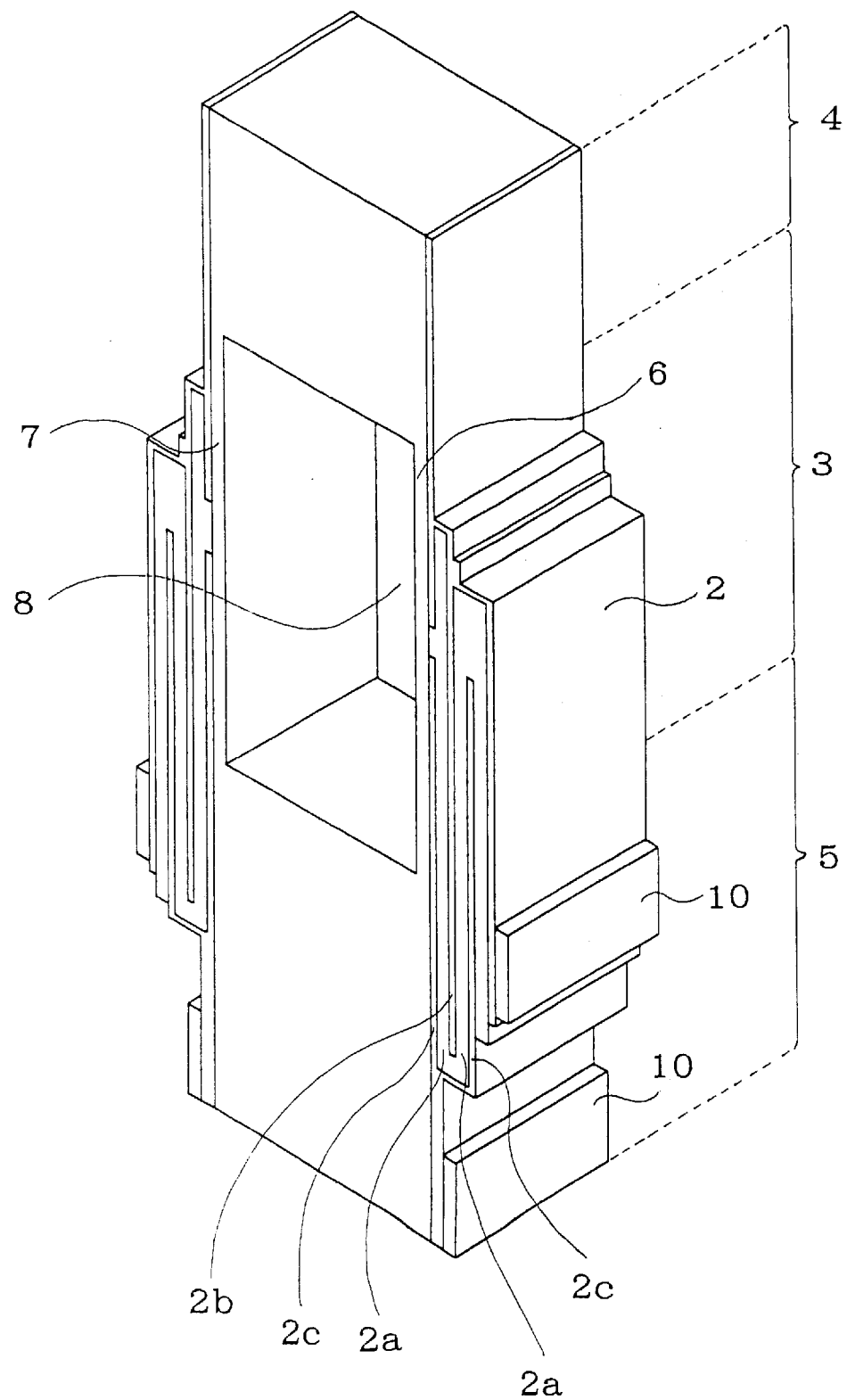
FIG. 30 is a schematic perspective view showing yet another embodiment of a piezoelectric/electrostrictive device of the present invention.

FIG. 29 shows an embodiment wherein a piezoelectric/ electrostrictive element is formed only on one of the thin plate portions facing each other. A device according to this structure can reduce rigidity of the thin plate portion not having a piezoelectric/electrostrictive element thereon in a pair of thin plate portions facing each other. If a device having a piezoelectric/electrostrictive element only on one side is compared with a device having piezoelectric/ electrostrictive elements on both sides with respect to displacement amount obtained by driving one piezoelectric/ electrostrictive element, the device having a piezoelectric/ electrostrictive element only on one side gives the larger displacement because the thin plate portion on the opposite site has a low rigidity A device shown in FIG. 30 is an embodiment wherein an end of the common second electrode 2b is positioned at an end of the movable portion, and an end of the common first electrode 2c and an end of the terminal electrode 10 for applying a driving signal to the first electrode 2c are positioned at an end of the fixing portion. Since patterns of the first and the second electrodes 2b, 2c and the terminal electrode 10 can be formed by the below mentioned machining, or the like, together with the movable, portion and the fixing portion, the production is easy. In addition, it is possible to keep constant the relation of the site of the terminal electrode 10 for the first electrode 2c and the site of the present device. This makes positioning of the terminal electrode and external apparatus easy in fixing the present device on the basis of an end surface of the fixing portion.

Figure 15:
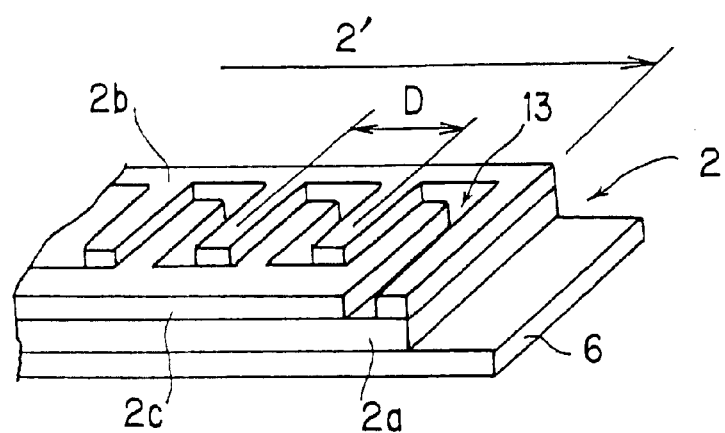
FIG. 15 shows a schematic perspective view of an embodiment of a piezoelectric/electrostrictive element constituting a piezoelectric/electrostrictive device of the present invention.

Moreover, a piezoelectric/electrostrictive element 2 comprising a first electrode 2c and a second electrode 2b respectively of comb-shaped structure, as shown in FIG. 15, the first electrode 2c and the second electrode 2b being structured to be mutually opposed with a predetermined gap between teeth of each other can also used. A piezoelectric/ electrostrictive element according to the present structure is advantageous in reducing power consumption. Though the first electrode 2c and the second electrode 2b are arranged on the upper surface of the thin plate portions 6 and 7 and a piezoelectric/electrostrictive layer 2a in FIG. 15, the electrodes may be formed between the thin plate portions 6 and 7 and the piezoelectric/electrostrictive layers 2a, or the electrodes may be preferably formed on the both surfaces one of which is upper surface of the piezoelectric/ electrostrictive layers 2a, and the another of which is the surface between the thin plate portions 6 and 7 and the piezoelectric/electrostrictive layers 2a. In other words, in the piezoelectric/electrostrictive element of the present structure, electrodes are formed at least on one major surface of at least a piezoelectric/electrostrictive layer 2a. Further, a piezoelectric/electrostrictive element 2 shown in FIG. 16 also comprises a first electrode 2c and a second electrode 2b respectively of a comb-shaped structure, and the first electrode 2c and the second electrode 2b are structured to be mutually opposed with a gap 13 of predetermined width between the teeth of each other. Whereas the piezoelectric/ electrostrictive element 2 is structured to have a piezoelectric/electrostrictive layer 2a embedded in a gap 13 between the first electrode 2c and the second electrode 2b, such piezoelectric/electrostrictive element 2 can also be preferably used.

Figure 16:
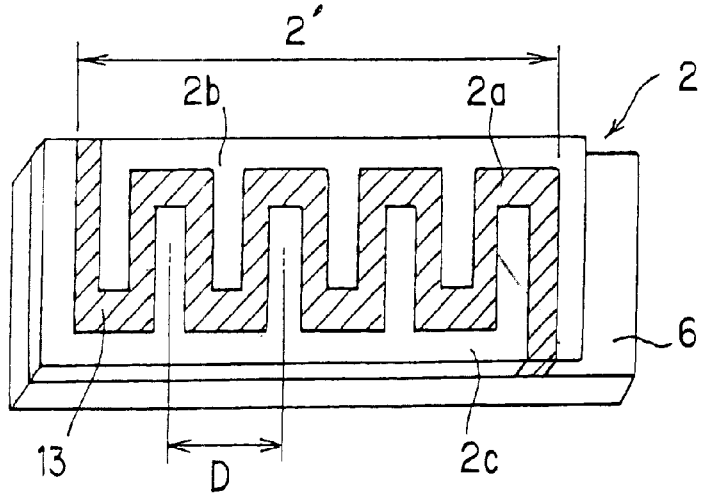
FIG. 16 shows a schematic perspective view of another embodiment of a piezoelectric/electrostrictive element constituting a piezoelectric/electrostrictive device of the present invention.

As piezoelectric/electrostrictive elements 2 shown in FIG. 15 and FIG. 16, when a piezoelectric/electrostrictive element 2 having comb-shaped electrodes is used, a displacement of a piezoelectric/electrostrictive element 2 can be made larger by reducing a pitch D of the teeth of a comb. When a voltage is applied across the comb-shaped electrodes, the voltage is applied between the electrodes (for example, between the first electrode 2c and the second electrode 2b ) causing an electric field to operate on the piezoelectric/electrostrictive layer 2a, based on the electric field, a electric field induced distortion is induced on the piezoelectric/electrostrictive layer 2a, and the piezoelectric/ electrostrictive elements 2 described in FIG. 15 and FIG. 16 have a function of, as a longitudinal effect of the electric field induced distortion, mainly generating a distortion in a mode extending in a direction of the electric field, namely in a direction parallel to the main surfaces of the thin plate portions 6 and 7. Accordingly, if a piezoelectric/ electrostrictive element of the structure is applied to a device of the present invention, the distortion extending in a direction toward the main surfaces of the thin plate portions 6 and 7 is converted into a bending displacement, which causes the thin plate portions 6 and 7 to bend, and the driving portion 3 is made to be bent and displaced in a direction toward the outer space (toward the hole) having a joined portion of the thin plate portions 6 and 7 with the movable portion 4 or of the thin plate portions 6 and 7 with the fixing portion 5 as fulcrums, and as the result, the movable portion 4 can be displaced in a predetermine direction. It should be noted that an element ordinarily having a structure of comb-shaped electrodes is arranged such that the pitch direction of the comb-shaped teeth is in a direction in which the fixing portion is connected with the movable portion on the thin plate portions 6 and 7. By arranging in this manner, the extension distortion based on the longitudinal effect of the electric field induced distortion can be effectively utilized as a bending displacement.

Moreover, although a piezoelectric/electrostrictive element 2 is, as shown in the above-described drawings, preferably formed on the outer surface of a device 1, in a point that the driving portion 3 can be driven in larger magnitude, the element may also be formed on the inner surface (namely inside the hole) of the device 1, or also on both the inner surface and the outer surface of the device 1. Further, when the element is formed on the inner surface of the device 1, there is a method, as to be described later, in that the element is simultaneously formed when the substrate portion, comprising at least the thin plate portions 6 and 7, the fixing portion 5, and the movable portion 4, is fabricated, so as to have the piezoelectric/electrostrictive operating portion 2' formed extending over the fixing portion 5 or the movable portion. As a material for a piezoelectric/ electrostrictive layer, a piezoelectric material is preferably used, however, a electrostrictive material, a material of ferroelectric substance, or a material of antiferroelectric crystal can also be used. However, when used for a magnetic head or the like, linearity between a displacement quantity of the movable portion and a driving voltage or an output voltage being considered to be important, it is preferable to use a material of small distortion hysteresis, and a material having a coercive electric field of 10 kV/mm or less can be preferably used.

Specific piezoelectric/electrostrictive materials are lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate, and the like, and they may be respectively used individually or contained in a material as mixture. Specifically, from a viewpoint of obtaining a material having high electromechanical coupling factor and piezoelectric constant, and obtaining stabilized composition by virtue of small reactivity with the thin plate portions (ceramics) when sintering a piezoelectric/electrostrictive layer, a material containing lead zirconate, lead titanate, and lead magnesium niobate as the major component, or a material containing sodium bismuth titanate as the major component is preferably used.

Moreover, any one of oxides and the like of the following may be used individually or as a material containing any ones of the oxides as mixture, namely, lanthanum, calcium, strontium, molybdenum, tungsten, barium, niobium, zinc, nickel, manganese,,cerium, cadmium, chromium, cobalt, antimony, iron, yttrium, tantalum, lithium, bismuth, tin, and the like. For example, by having lead zirconate, lead titanate, and lead magnesium niobate, which are the major components, contained with lanthanum or strontium, adjustment of a coercive electric field, piezoelectric properties, or the like is made possible. It is of course that an attention is to be paid, when a material is to be selected, to a relationship between the Young's modulus Y2 of a material composing a piezoelectric/electrostrictive layer and the Young's modulus Y1 of a material composing the thin plate portions 6 and 7 so that the following expression is satisfied, namely;

$$1 < Y1/Y2 \leq 20.$$

Further, it is desirable that a material which is likely to be vitrifies such as silica or glass is refrained from adding. The reason is that a material such as glass, silica or the like is liable to be reacted with a piezoelectric/electrostrictive material, when a piezoelectric/electrostrictive layer is thermally treated, thus the composition thereof is fluctuated, causing deterioration of the piezoelectric properties.

On the other hand, an electrode of a piezoelectric/electrostrictive element is preferably composed of a metal which is solid at room temperature and superior in conductivity, such as, for example, aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like, may be used singularly, as a mixture, or as an alloy thereof, and further, a cermet material composed of the above-described materials dispersed with the same material as for a piezoelectric/electrostrictive layer or the thin plate portions may also be used.

Selection of a material for an electrode in a piezoelectric/electrostrictive element is determined depending on a method of forming a piezoelectric/electrostrictive element 2. For example, when a first electrode 2c is first formed on the thin plate portions, and then a piezoelectric/electrostrictive layer 2a is formed on the first electrode 2c by sintering, it is necessary to use, as the first electrode 2c, a metal of high-melting point such as platinum or the like which is uninfluenced at the sintering temperature of the piezoelectric/electrostrictive layer 2a, however, a second electrode 2b, to be formed on the piezoelectric/electrostrictive layer 2a after the piezoelectric/electrostrictive layer 2a is formed, can be formed at a low temperature, thus a metal of low melting point, such as aluminum, gold, silver, or the like, can be used.

Further, as the thickness of an electrode may also cause not a small, deterioration of a displacement of a piezoelectric/electrostrictive element, particularly for a second electrode 2b shown in FIG. 14 to be formed after a piezoelectric/electrostrictive layer is sintered, or comb-shaped electrodes 2b and 2c shown in FIG. 15, it is preferable to use a material of organic metal paste, for example, gold resinate paste, platinum resinate paste, silver resinate paste, or the like, which assures a finer and thinner film after being sintered.

Although there are a variety of modes conceivable for electrode leads from a piezoelectric/electrostrictive element 2, in a device 1 according to the present invention, where a piezoelectric/electrostrictive element 2 is respectively formed on both of opposing thin plate portions 6 and 7, one mode is that a first electrode 2c is made for common use by two piezoelectric/electrostrictive elements 2, and the electrode is drawn out to the fixing portion 5 side of one surface where the hole 8 is apertured, and a second electrode 2b is directly drawn out to the fixing portion 5 side of a surface where respective piezoelectric/electrostrictive elements 2 are formed (FIG. 9). Another embodiment (FIG. 13) is that both the first electrode 2c and the second electrode 2b are drawn out to one surface of the fixing portion 5 side where the hole 8 is apertured. In such embodiments, a portion of the fixing portion 5 side of the other surface where the hole 8 is apertured (symbol 9 in FIG. 13) is unformed of any electrode, and the portion is available for a device to be fixed, and therefore the device can be reliably fixed. Moreover, if the device is fixed on one surface side where the hole 8 is apertured, bonding of electrodes and the fixing can be simultaneously performed, which is advantageous in compaction and the like.

Figure 17A:
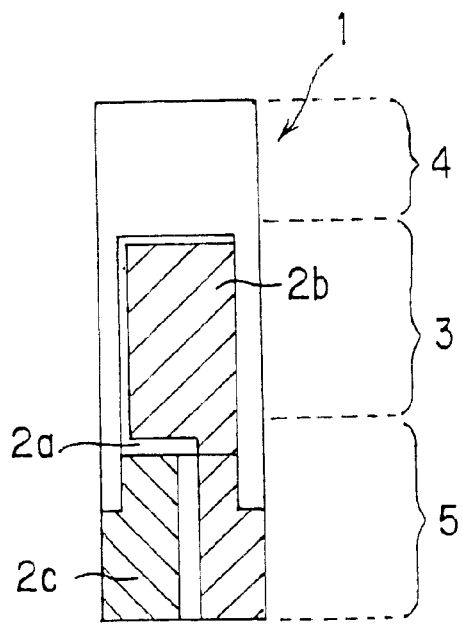
FIGS. 17(a) and (b) show schematic explanatory views of an embodiment of an arrangement method of electrode leads of a piezoelectric/electrostrictive device of the present invention.
Figure 17B:
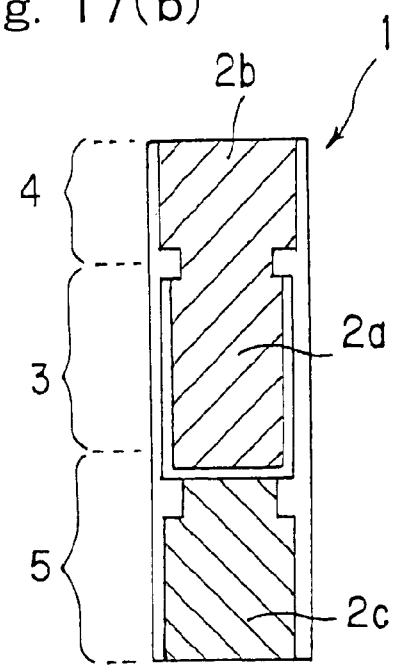

Further, there may also be a mode, as shown in FIG. 17(a), where both a second electrode 2b and a first electrode 2c are drawn out so as to be juxtaposed on the fixing portion 5 side of surfaces where respective piezoelectric/electrostrictive elements 2 are formed, or a mode, as shown in FIG. 17(b), where a second electrode 2b and a first electrode 2c are respectively drawn out separately to the movable portion 4 side and the fixing portion 5 side of respective surfaces where piezoelectric/electrostrictive elements are formed.

3. Method of Fabricating the Device

Now, a method of fabricating a device of the present invention is described.

It is preferable that the device of the present invention comprises respective members composed of a ceramic material, and as the constituting elements of the device, base members except for a piezoelectric/electrostrictive element, namely thin plate portions, a fixing portion, and a movable portion are fabricated by use of the ceramic green sheet laminating method, and more preferably fabricated by laminating integration by simultaneous sintering. On the other hand, it is preferable that a piezoelectric/electrostrictive element and respective terminals are fabricated by use of film forming methods for a thin film, a thick film, or the like for forming such members into film-like members. The ceramic green sheet laminating method is capable of integrally forming the above-described respective substrate members of a device, and is an easy method in securing high reliability of joined portions and stiffness of the device, as there is scarcely any state variation with time at joined portions of respective members. In a device according to the present application, joined portions of the thin plate portions, which constitute the driving portion, with the fixing portion and the movable portion function as the fulcrums for developing a displacement. So, bonding reliability at the joined portions is a very important point dominating characteristics of the device. Further, as the method is superior in productivity and moldability, a device of a predetermined shape can be fabricated thereby in shorter time and better reproducibility. It should be noted that although terminology of "a thin plate" and "a thin plate portion" are used in the specification of the present application, the former is used, in principle, for a member related to a green sheet in the method of fabrication, while the latter indicates a portion constituting the driving portion together with a piezoelectric/electrostrictive element in a laminated body.

(1) Method of Fabricating the Laminated Body

To start with, in order that the Young's modulus Y1 of a material composing the thin plate portions and the Young's modulus Y2 of a material composing the piezoelectric/electrostrictive layer satisfies the following expression, namely;

$1 < Y1/Y2 \leq 20$, a slurry is prepared by adding and mixing a binder, a solvent, a dispersant, a plasticizer, or the like into ceramic power of selected zirconia or the like, the slurry is then processed for degassing, and used for fabricating a ceramic green sheet having a predetermined thickness, by way of the reverse roll coater method, the doctor blade method, or the like.

Figure 18A:
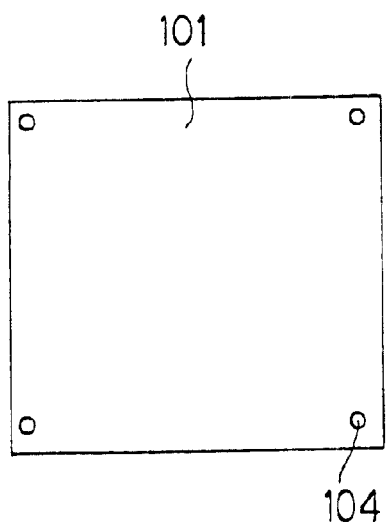
FIGS. 18(a) and (b) show schematic explanatory views of examples of ceramic green sheets used in fabricating a piezoelectric/electrostrictive device of the present invention.
Figure 18B:
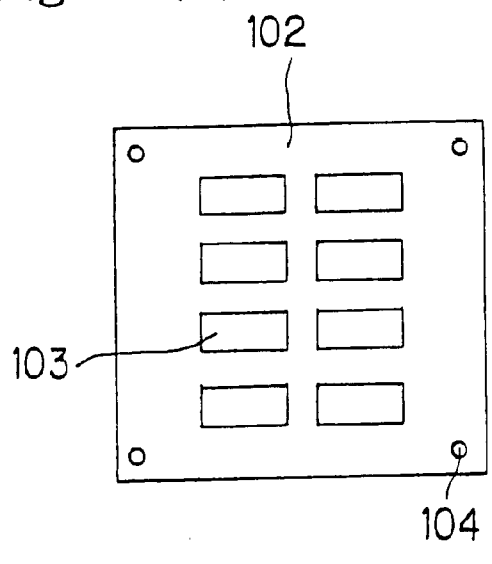

Then, the ceramic green sheet is machined into a variety of shapes, for example, shapes as shown in FIG. 18, by means of stamping using a die (punching), laser machining, or the like. It should be noted that the fabrication of a laminated body may basically be relied on a method disclosed in the specification of U.S. patent application Ser. No. 09/441914 filed on Nov. 17, 1999. Thus, the content of the application is incorporated herein by reference.

In FIG. 18(*a*), a ceramic green sheet 101 exemplarily shows a ceramic green sheet mainly to be a thin plate after being sintered, and a ceramic green sheet 102 having at least one rectangular hole 103 formed thereon exemplarily shows one ceramic-green sheet for members to be a movable portion and a fixing portion. With the ceramic green sheet 102, a plurality of devices can be obtained at one time, or at least one device having a plurality of movable portions can be obtained, by forming one row or more holes 103 so as to be juxtaposed. By use of at least two ceramic green sheets to be thin plates, and at least one ceramic green sheet having at least one hole formed thereon, prepared in advance, and by laminating at least one ceramic green sheet having at least one hole formed thereon, for example, between at least two ceramic green sheets to be the thin plates, a ceramic green laminated body comprising ceramic green sheets to be a pair of thin plates and a series of ceramic green sheets having at least one hole formed thereon may be prepared.

Of course, there is no specific limitation whatsoever on method of preparing the ceramic green laminated body, in other words, on laminating sequence of the ceramic green sheets to be the thin plates and the ceramic green sheets having at least one hole formed thereon, and ordinarily, lamination is possible at an optional sequence so long as the processes to follow are not influenced by the laminated body.

For example, steps preparing the ceramic green laminated body includes, a step for laminating ceramic green sheets to be a pair of thin plates, mutually opposed, a step for laminating ceramic green sheets to be a pair of thin plates on the outermost layers, mutually opposed, a step for preparing a ceramic green sheet to be a thin plate laminated with at least one ceramic green sheet having at least one hole formed thereon, a step for preparing a ceramic green sheet to be a thin plate laminated with the desired number of ceramic green sheets having at least one hole formed thereon, a step for preparing at least one ceramic green sheet having at least one hole formed thereon laminated by ceramic green sheets to be a pair of thin plates on the outermost layer thereof mutually opposed, a step wherein two laminated bodies A prepared by a ceramic green sheet to be a thin plate laminated with at least one ceramic green sheet having at least one hole formed thereon are prepared, and one sheet of a ceramic green sheet having at least one hole formed thereon or a laminated body B laminated with a plurality of said ceramic green sheets is prepared, and when the two laminated bodies A are laminated so as to have respective thin plates respectively forming the outermost layers, the one sheet of a ceramic green sheet having at least one hole formed thereon or the laminated body B is intervened, and the like.

Furthermore, when a device according to the present invention is fabricated by such ceramic green sheet laminating method, when forming a hole by laminating thick sheets, difference in dimensions between lengths of a pair of thin plate portions governing the driving portion is likely to be caused, by chance, by shrinkage of ceramic green sheets, by deterioration in machining precision derived from difference in dimension precision accompanied to machining of thick ceramic green sheet, or by shifting of positions due to deformation of sheets while laminating, or the like. The difference in dimensions of the pair of thin plates is displayed per se as the difference of the displacement in the right-to-left direction (X-axis direction), and further makes the movable portion liable to contain a component toward the rotational direction in the displacement mode thereof, thus the movable portion is made difficult to dominantly displace toward a specific axis.

These problems are countered by employing a step wherein, when laminating at least a plurality of ceramic green sheets having at least one hole formed thereon, a ceramic green sheet mounted on a plastic film and having at least one hole formed thereon is laminated on a surface to be the outermost surface of the ceramic green laminated body having at least one hole formed thereon such that the plastic film is made to be a new outermost layer, and after the hole is accurately positioned, the plastic film is removed, or a step wherein a ceramic green sheet mounted on a plastic film and having at least one hole formed thereon is laminated on a ceramic green sheet to be the thin plate such that the plastic film is made to be an outer layer, and after the hole is accurately positioned, the plastic film is removed, thus not only deformation of a ceramic green sheet at handling thereof can be substantially avoided, but also both surfaces to be the outermost surfaces respectively can be made to be in the same shape, enabling accurate positioning of the hole, thus lamination precision is improved, and dimensions are stabilized by improvement of the machining precision, with a result that characteristics of the device, for example, displacement characteristics, are improved.

Further, of the above-described methods of fabrication using the plastic film, the former is higher in laminating efficiency required by the time the final laminated body is obtained, and effective in reducing the number of steps. On the other hand, the latter is advantageous in providing a bonding auxiliary layer, to be described hereinafter, in order that the bonding property at a laminating interface is ensured.

In other words, as to the number of laminating steps, the former is more efficient, since a ceramic green sheet formed on a plastic film can be laminated with the other ceramic green sheet having a hole at one time, and lamination with opposing surfaces where plastic films are removed after lamination, and with ceramic green sheets to be thin plates can be respectively performed also at one time, thus all lamination required can be done by minimum two times lamination. However, the number of lamination for the latter is minimum three times, one more than the former, as mutually opposing thin plates require separate laminations for the ceramic green sheet to be a thin plate and for the ceramic green sheet mounted on a plastic film and having a hole, respectively, and thereafter the ceramic green sheet having a hole formed thereon is laminated.

Moreover, as to the adhering auxiliary layer for improving the laminating property of ceramic green sheets, ordinarily, the adhering auxiliary layer is formed substantially on entire surface of a ceramic green sheet prior to machining of the hole or the like, and thereafter a hole of a predetermine shape is formed by punching or the like using a die, and then a predetermined number thereof are laminated, however, when this is applied to the former method, after the film is exfoliated and removed, a bonding auxiliary layer is required to be formed on a laminating surface with a thin plate. At this time, despite that a shape is accurately produced by die machining or the like, with the bonding auxiliary layer formed, possibility is larger that the shape precision is lowered. Although there is means to provide a bonding auxiliary layer for the green sheet to be the thin plate, ordinarily the thickness variation of the bonding auxiliary layer being larger than the thickness variation of the green sheet to be the thin plate, not only totaled thickness variation is increased, but also the thin plate is thickened as much as the thickness of the bonding auxiliary layer, thus the characteristics as the device is lowered. Contrarily, when this is applied to the latter, a bonding auxiliary layer can be formed on the ceramic green sheet, in a state the ceramic green sheet is mounted on a plastic film, thus a hole can be machined after the bonding auxiliary layer is formed. Accordingly, the precision of the hole is secured by the precision of a die, and the green sheet to be the thin plate is untouched whatsoever, enabling compatibility of high laminating reliability and high dimension precision. As to the surface where a plastic film is exfoliated and removed, laminating reliability is secured by a bonding auxiliary layer formed on a separate ceramic green sheet having a hole formed thereon to be laminated on the surface.

Though both the former method and the latter method have a common target of obtaining stabilized shape of the thin plate portions, there are respective features in steps of fabrication, and the methods can be suitably selected depending on structure and the like of a laminated body.

It should be noted that a ceramic green sheet mounted on a plastic film and having at least one hole formed thereon includes not only a ceramic green sheet having a hole formed thereon, prepared from a ceramic green sheet on a plastic film by die-punching machining or laser machining, but also a ceramic green sheet having at least one hole, formed in advance in a predetermined shape, with a plastic film applied thereon. Further, the plastic film is preferably a poly(ethylene-terephthalate) film from the points of exfoliating property, mechanical strength, or the like. Furthermore, the ceramic green sheet mounting surface of the plastic film is preferably a film coated by a mold-releasing agent containing silicone or the like as a component for improving exfoliating property of the green sheet. Further, the thickness of the ceramic green sheet on the plastic film is preferably thinner, and desirably, the thickness is more preferable to be equivalent to the thickness of the green sheet for the thin plate. The reason is that by thinning the ceramic green sheet, machining precision of the ceramic green sheet per se can be improved. Furthermore, in order to facilitate handling of respective green sheets, specifically the ceramic green sheets to be the thin plates, to prevent elongation and sagging of a sheet, and to stabilize the shape of the thin plate portions, it is preferable to handle the sheets attached to the above-described plastic film.

Specific examples when a ceramic green laminated is prepared are hereinafter described. Examples quoted herein are merely illustrations, and it goes without saying that a case when a ceramic green sheet is prepared is not limited in any way to these examples.

Lamination Example 1

After sequentially laminating a ceramic green sheet (hereinafter referred to as "GS") for the thin plates 1, GS1 having a hole formed thereon, GS2 having a hole formed thereon, GS3 having a hole formed thereon, GS4 having a hole formed thereon, and GS2 for the thin plates, as shown in FIG. 19, a ceramic green laminated integrated body is obtained by compressing.

Lamination Example 2

Step 1: After GS1 for the thin plates is laminated with GS1 having a hole formed thereon, a ceramic green laminated integrated body is obtained by compressing.

Step 2: After GS4 having a hole formed thereon is laminated with a ceramic green sheet 2 for the thin plates, a ceramic green laminated integrated body is obtained by compressing.

Step 3: A ceramic green laminated integrated body obtained in Step 1, GS2 having a hole formed thereon, GS3 having a hole formed thereon, and a ceramic green laminated integrated body obtained in Step 2 are sequentially laminated, and a ceramic green laminated integrated body is obtained by compressing.

Lamination Example 3

Step 1: GS1 having a hole formed thereon, GS2 having a hole formed thereon, GS3 having a hole formed thereon, and GS4 having a hole formed thereon are sequentially laminated, and a ceramic green laminated integrated body is obtained by compressing.

Step 2: GS1 for the thin plates, a ceramic green laminated integrated body obtained in step 1, and GS2 for the thin plates are sequentially laminated, and a ceramic green laminated integrated body is obtained by compressing.

Lamination Example 4

Step 1: GS2 having a hole formed thereon is laminated with GS3 having a hole formed thereon, and a ceramic green laminated integrated body is obtained by compressing.

Step 2: GS1 for the thin plates, GS1 having a hole formed thereon, a ceramic green laminated integrated body obtained in step 1, GS4 having a hole formed thereon, and GS2 for the thin plates are sequentially laminated, and a ceramic green laminated integrated body is obtained by compressing.

The ceramic green laminated integrated bodies obtained in the above-described examples 1 to 4 are sintered and integrated sintered bodies are obtained. However, the above-described examples do not show all methods of fabricating the devices according to the present invention, and there is no specific limitation whatsoever on the number and the sequence of the compressing for the laminating integration.

The number and the sequence of the compressing are suitably determined so that desired structure can be obtained, depending on structure, for example, the shape of the hole, the number of sheet of the ceramic green sheet having a hole formed thereon, the number of sheet of the ceramic green sheet for the thin plates, or the like.

Of course, the shape of the hole is not required to be the same for all, and is determined depending on desired functions. Moreover, there is no specific limitation whatsoever on the number of sheet and the thickness of respective ceramic green sheets.

As the above-described compressing can be further improved of the laminating properties thereof by heating, compressing under heating can be also advantageously employed. Furthermore, it is also preferable to use a bonding auxiliary layer, as the laminating properties of a ceramic green sheet interface can be improved by coating, or printing, a paste, a slurry or the like containing ceramic powder, preferably, of the same or similar composition as the one used for the ceramic green sheet, in view of securing reliability, and a binder as the major component, on a ceramic green sheet to form a bonding auxiliary layer thereon.

Further, a protrusion may be provided at a portion on the outer surface of the layer of at least on one side of the outermost layer of the ceramic green laminated body, excepting at least the thin plates. A device according to the present application has a piezoelectric/electrostrictive element formed on the outer surface of mutually opposing thin plate portions, ordinarily by known means such as the screen printing method, or the like, so, when the piezoelectric/electrostrictive element is formed, for example, by the screen printing method, a damage to elements can be prevented, as the surface, where the elements are formed, formed on the opposite surface, is prevented from touching directly a bed such as a stage for printing, a setter for sintering, or the like, by the protrusion formed. Furthermore, by suitably selecting the height of the protrusion, the thickness of the elements can be controlled. Although the protrusion can be formed on a sintered green laminated body, namely on a ceramic laminated body, it is more preferable to have the protrusion formed on a green laminated body to be sintered and integrated from the points of stability of the structure and stability in dimensions.

Figure 20A:
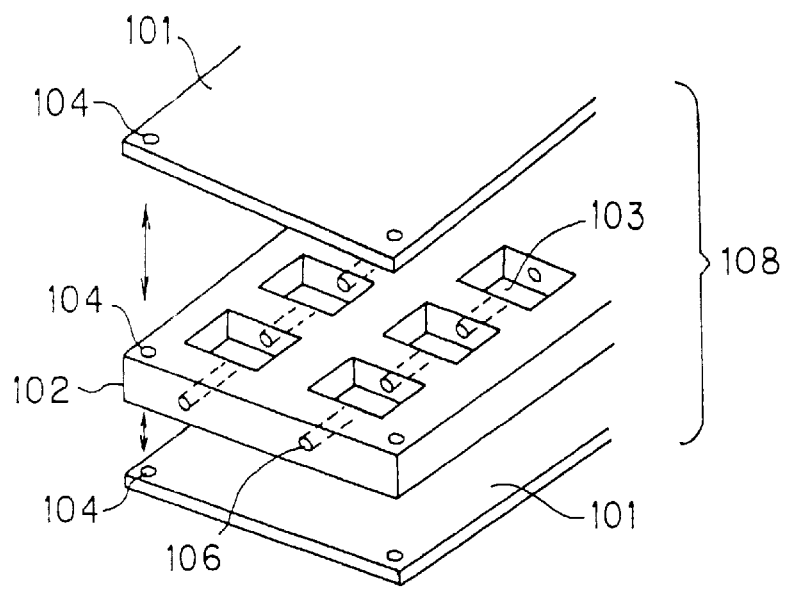
FIGS. 20(a), (b), (c), and (d) show process views of an embodiment of a method of fabricating a piezoelectric/electrostrictive device of the present invention.
Figure 20B:
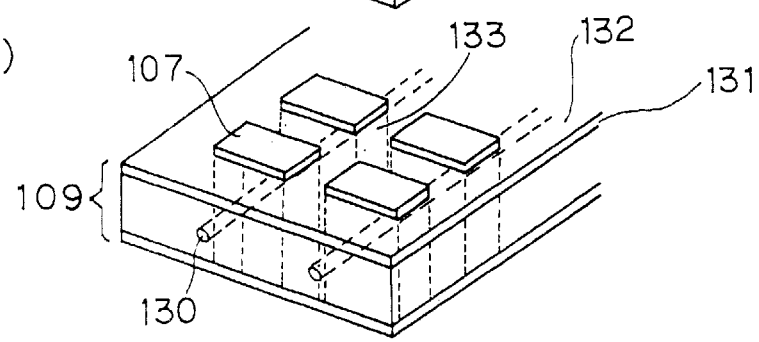
Figure 20C:
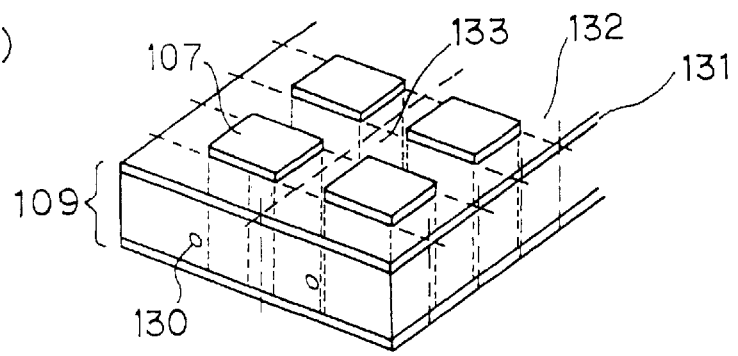
Figure 20D:
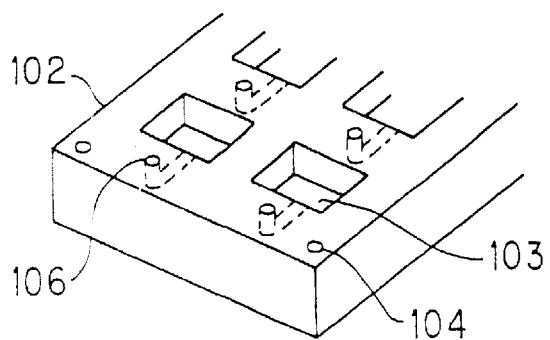

An example of a method of fabricating a device according to the present invention is briefly described with reference to FIGS. 20(a) to 20(d), and FIG. 21. FIG. 20(a) shows an exemplary perspective view of a structure of a ceramic green laminated body 108 prior to sintering, FIG. 20(b), and FIG. 20(c) show perspective views of a structure of a laminated sintered body 132 with piezoelectric/electrostrictive elements formed thereon, FIG. 20(d) shows an exemplary perspective view of a structure of a ceramic green sheet having a hole formed thereon.

As shown in FIG. 20(a), a ceramic green sheet 101 to be a thin plate after being sintered, a ceramic green sheet 102, maybe comprising a plurality of sheets, having at least one hole formed thereon, and a ceramic green sheet 101 to be a thin plate after being sintered, are laminated in the sequence while positioning utilizing reference holes 104, and integrated by use of previously described method such as thermo-compression bonding or the like, thus a ceramic green laminated body 108 can be obtained. When the ceramic green laminated body 108 is too thick, a ceramic green laminated body 105 is halved, in advance, to form an upper and a lower ceramic green laminated bodies, as shown in FIG. 21, and the halved bodies are joined so as to have the holes faced each other, and a final ceramic green laminated body 108 may be obtained.

As for the ceramic green laminated body 108, it is necessary that communicating holes 106 for communicating portions of ceramic green sheet 102 to be holes 103 with the outer space are formed in advance on the ceramic green sheet 102 by punching by use of a die or the like, or the communicating holes 106 are bored after a plurality of the ceramic green sheet 102 are laminated. However, as long as respective holes 103 are communicated with the outer space, there is no specific limitation whatsoever about shape of the communicating holes 106, and in addition to a type in which respective communicating holes run through a plurality of the holes as shown in FIG. 20(a), there may be other types such as shown in FIG. 20(d) where the holes 103 are respectively communicated with the outer space. A ceramic green laminated body 108 thus integrated by these methods are sintered at a temperature around 1200 to 1600° C. as to be described hereinafter. However, there may be an occasion when a ceramic laminated body 109 thus obtained after being sintered has an unintended warping. In the case, it is preferable that the ceramic laminated body 109 is flattened by being re-sintered (hereinafter referred to as "warping correction") with a weight placed thereon at a temperature close to the above-described sintering temperature. In this warping correction, it is preferable to use a porous ceramic plate such as a planar alumina or the like. Further, in warping correction, in addition to performing the warping correction following the sintering, it is also preferable to flatten simultaneously with sintering, with the above-described weight placed thereon in advance.

(2) Formation of Piezoelectric/Electrostrictive Element

As to a piezoelectric/electrostrictive element, when a device of the present invention is fabricated, a piezoelectric/electrostrictive element 107 can be formed in a desired number on the surface of thin plates of a ceramic laminated body 109 by use of a thick film method, such as the screen printing method, the dipping method, the coating method, the electrophoresis method, or the like, or a thin film method, such as the ion-beam method, the sputtering method, the vacuum deposition method, the ion-plating method, the chemical vapor deposition method (CVD), plating, or the like (refer to FIG. 20(b)). However, FIG. 20(b) only exemplarily shows a piezoelectric/electrostrictive element 107, and does not show accurate arrangement of the piezoelectric/electrostrictive element 107. In addition, although a thin plate 131 of a ceramic laminated body 109 is denoted by solid lines in FIG. 20(b) and FIG. 20(c), this is only to understandably describe the portion, and as the member is integrally sintered, there is no such boundary, which is a matter of course. Further, it is required that at least one end of a piezoelectric operating portion of the piezoelectric/electrostrictive element 107 exists on the fixing portion or the movable portion, the other end thereof is arranged on the thin plate portions 6 and 7, and an end of a piezoelectric/electrostrictive layer of the other end side thereof is formed by the above-described method so as also to be on the thin plate portions within a range not exceeding the entire length of the thin plate portions 6 and 7. Of course, in the case, it is necessary to select materials such that the Young's modulus Y2 of a material composing the piezoelectric/electrostrictive layer and the Young's modulus Y1 of a material composing the thin plate portions satisfy the following expression, namely;

$$1 < Y1/Y2 \leq 20.$$

By forming a piezoelectric/electrostrictive element in this manner, the piezoelectric/electrostrictive element and the thin plate portions can be integrally joined and arranged without using an organic adhesive such as an epoxy resin, an acrylic resin, or the like, thus reliability and reproducibility are secured, and integration is facilitated, which are advantageous. Specifically, in a method of fabrication in the present invention, it is preferable that at least a piezoelectric/electrostrictive layer 2a of the piezoelectric/electrostrictive element 107 is formed by the previously described thick film method, and a ceramic laminated body and a piezoelectric/electrostrictive element are integrated by heat treatment without use of an organic adhesive. It is more preferable that a piezoelectric/electrostrictive layer in which glass is not contained can be composed by integration by heat treatment at least without adding glass frit to the piezoelectric/electrostrictive layer, thus displacement characteristics can be advantageously improved. The reason is that according to these thick film methods, a piezoelectric/electrostrictive layer can be formed using a paste, a slurry, a suspension, an emulsion, a sol, or the like, containing particles or powder of piezoelectric ceramics of average particle size of 0.01 to 5 mm, preferably 0.05 to 3 mm as the major component, thus favorable piezoelectric operating characteristics can be obtained. Specifically, the electrophoresis method has an advantage that a film can be formed in high density and in high shape precision. On the other hand, the screen printing method is employed as the most preferable method of fabricating a device according to the present invention, as it enables simultaneous formation of a film and a pattern, and also enables formation of a plurality of piezoelectric/electrostrictive elements on the same ceramic laminated body with ease.

Specifically, a piezoelectric/electrostrictive element can be formed in a method where a ceramic green laminated body 108 is sintered at a predetermined conditions, preferably at a temperature of 1200 to 1600° C., then in sequence, a first electrode is printed and sintered at a predetermined position on the surface of a thin plate 131, then a piezoelectric/electrostrictive layer is printed and sintered, further a second electrode is printed and sintered, thus a piezoelectric/electrostrictive element can be formed. Further, an electrode lead for connecting an electrode with a driving circuit is printed and sintered. Here, if a material for respective members is selected so as to have gradually lowering sintering temperatures, such as platinum (Pt) for a first electrode, lead zirconate titanate (PZT) for a piezoelectric/electrostrictive layer, gold (Au) for a second electrode, and further silver (Ag) for an electrode lead, re-sintering of a material once sintered previously will not occur at any sintering stage, and thus generation of troubles such as exfoliation or aggregation of an electrode material or the like can be prevented.

It should be noted that, by selecting a material, it is possible to sequentially print respective members and. electrode leads of a precursor (formed body to be sintered) to be integrally sintered at a time, while respective electrodes and the like may be provided at a lower temperature after a piezoelectric/electrostrictive layer is formed. Further, respective members and electrode leads of the piezoelectric/electrostrictive element may be formed by the thin film method, such as the sputtering method, the deposition method, or the like, and in this case, heat treatment is not necessarily required. Moreover, it is also preferable that a precursor of the piezoelectric/electrostrictive element 107 is formed in advance at a position finally to be the thin plate portions of the ceramic green laminated body 108, so that the ceramic green laminated body 108 and the piezoelectric/electrostrictive element are simultaneously sintered.

The simultaneous sintering may also be performed together with all composing films of the precursor of the piezoelectric/electrostrictive element 107, and furthermore, available methods includes a method where only a first electrode and a ceramic green laminated body 108 are simultaneously sintered, a method where composing films, excepting a second electrode, and a ceramic green laminated body are simultaneously sintered, and the like. Methods to have a precursor of a piezoelectric/electrostrictive element 107 and a ceramic green laminated body 108 simultaneously sintered include a method where a piezoelectric/electrostrictive layer is formed by the tape molding method by use of a slurry material, the pre-sintering piezoelectric/electrostrictive layer is laminated on a predetermined portion of the ceramic green sheet 101 to be the thin plate by thermo-compression bonding or the like, then the ceramic green sheet 102 having the hole 103 formed thereon is laminated and compressed thereon, an then the laminated body is simultaneously sintered, thus a movable portion, a driving portion, thin plate portions, and a piezoelectric/electrostrictive layer are simultaneously fabricated. However, in this method, electrodes are to be formed in advance on the thin plate and/or a piezoelectric/electrostrictive layer. Further, in addition to the above-described method, one of the other methods is that electrodes and a piezoelectric/electrostrictive layer which are respectively composing layers of a piezoelectric/electrostrictive element are formed by screen printing method on a position, at least finally (after being sintered) to be the thin plate portions, of a ceramic green laminated body 108, then the entirety is simultaneously sintered. On the other hand, it may be formed by bonding an independently prepared piezoelectric/electrostrictive element at a predetermined portion of the base with an adhesive such as an organic resin and glass, or by blazing, soldering, eutectic bonding, or the like, as well as integration of a base using such firing, i.e., thin plate portions, a fixing portion, a movable portion, and a piezoelectric/electrostrictive element. In this case, an independent piezoelectric/electrostrictive element may be formed by forming a precursor of the piezoelectric/electrostrictive layer by pressure molding using a mold, casting, or injection molding, as well as the aforementioned tape casting method, firing the precursor, and forming the predetermined electrode. In this case, the electrode may be formed previously on the precursor of the piezoelectric/electrostrictive layer to be simultaneously fired. However, it is preferred to form a piezoelectric/electrostrictive element, without using an adhesive such as an organic resin, a glass and the like on the sintered ceramic laminated body 109 by a film forming method, preferably by the screen printing method. This is because a higher pattern precision and uniform film thickness can be obtained, thereby the warpage as a structure can be reduced. Additionally, the method may be employed preferably from the long term reliability because it may be formed as a monolithic structure since there does not exist any foreign material between the respective constituting elements of the device.

Though sintering temperature of respective films composing a piezoelectric/electrostrictive element is suitably determined depending on a material composing the element, generally it is 500 to 1500° C., and for a piezoelectric/electrostrictive layer, preferably 1000 to 1400° C. In this case, in order to control the composition of a piezoelectric/electrostrictive layer, it is preferable that sintering is performed under existence of an evaporation source of a material of the piezoelectric/electrostrictive layer. It should be noted that when a piezoelectric/electrostrictive layer and a ceramic green laminated body 108 are simultaneously sintered, sintering conditions of the both are to be matched.

When fabricating a device having a piezoelectric/electrostrictive element formed respectively on both thin plate portions of a pair of mutually opposing thin plate portions, a precursor of a piezoelectric/electrostrictive layer, precursors of electrode films, and the like may be advantageously printed on both sides of a ceramic laminated body 109, however, in such case, it is preferable that a counter measure is taken lest the precursor of the piezoelectric/electrostrictive layer, the precursors of electrodes, and the like should stick or contact a printing stage, by printing in either of the methods of ① that printing is performed on a printing stage where a cavity is provided thereon, or ② that a frame-shaped convex is formed on a periphery of a printing position on at least one of printing surface of a ceramic laminated body, and a surface where the convex is formed is first printed followed by printing of the other surface, or the like. Moreover, specifically in sintering the aboved-described piezoelectric/electrostrictive layer, when piezoelectric/electrostrictive elements are formed on both sides of a ceramic laminated body, it is preferable that sintering atmosphere of the both sides is made to be the same, lest there should be difference in the piezoelectric characteristics of respective piezoelectric/electrostrictive elements on the both sides. For example, ordinarily, a ceramic laminated body-with a precursor of a piezoelectric/electrostrictive element (film) formed thereon is placed on a board such as a setter or the like for being sintered, in this case, gaps between setters to be interstacked are to be adjusted by a spacer or the like so that a space between a piezoelectric/electrostrictive layer and the setter is made to be same.

Although the above-described are specific examples of film forming methods preferably employed for the present invention, fabrication of the device is also possible by a method where piezoelectric/electrostrictive elements sintered in advance as separate bodies are adhered to predetermined positions of a ceramic laminated body 109 by an adhesive such as an organic resin or the like.

(3) Cutting the Laminated Body

A previously described laminated sintered body 132 having a piezoelectric/electrostrictive elements is, after the piezoelectric/electrostrictive element and electrode leads are subjected to treatments of coating, shielding, and the like, cut in a laminating direction of a ceramic green sheet, so as to have a rectangular hole 133 apertured on a side of the laminated body, thus a plurality of the devices can be simultaneously obtained (FIG. 20(c)). As for methods of cutting, in addition to the dicing machining, the wire-saw machining (mechanical machining), or the like, the machining by the YAG laser, the excimer laser, or the like, or the electron-beam machining can be employed. When cutting into respective desired units, it is preferable that the cut bodies are thermally treated at a temperature of 300 to 800° C. after being cut. The reason is that the machining is likely to cause a defect such as a micro-crack or the like inside the sintered body, and the defect can be removed by the heat treatment, thus improving reliability thereof. Further, after the heat treatment, it is preferable to leave the cut bodies for at least about 10 hours at a temperature around 80° C. for aging treatment. By this treatment, a variety of stress or the like suffered during the processes of fabrication may be relieved, thus contributing to improvement of the characteristics.

When fabricating a device of the present invention, cutting is performed so as to have a hole of a desired shape, for example, a rectangular-shaped hole 133, apertured on aside of a laminated body. Such cutting has advantages not only separating a plurality of devices but also simultaneously forming thin plate portions and a hole of a device, for example, in case of the device shown in FIG. 8, the thin plate portions 6 and 7 and a hole 8, and is preferable since a structure which is complicated because two or more rectangular solids are combined by thin plates, and therefore is difficult to be fabricated, is simply obtained.

Moreover, by suitably changing the number of formation and the position of formation of a hole 103 in a ceramic green sheet 102, or the cutting position of a laminated sintered body 132 having a piezoelectric/electrostrictive element 107, a device having a plurality of driving portions or a device having different lengths of the driving portion can be formed with extreme ease. Further, by simultaneously cutting a ceramic laminated body 109 and a piezoelectric/electrostrictive element 107, a device having the thin plate portions and the piezoelectric/electrostrictive element in the same width can be fabricated with ease, which is preferable. These cutting may also be applied to a green state prior to the sintering, however, it is preferable to apply to a sintered body, in order to improve dimension precision and to prevent release of particles of respective ceramic powder.

Furthermore, a device of the present invention can also be fabricated not only by using a ceramic green sheet as described above, but also by using the pressure molding method or the cast molding method by use of a shaping die, the injection molding, photolithography, or the like. Though the movable portion 4, the fixing portion 5, and the thin portions 6 and 7 are made of ceramics in the aforementioned embodiment, each member may be made of metallic materials. Further, it may be composed as a hybrid structure wherein a member made of ceramic and a member made of metal are used in combination. In this case, bonding with an organic resin, glass, or the like, or brazing, soldering, eutectic bonding, welding, or the like, may be employed for bonding metallic materials or a ceramic material and a metallic material. In the case that all of the movable portion 4, the fixing portion 5, the thin plate portions 6 and 7 are made of a metal, for example, a portion corresponding to the ceramic laminated body 109 in FIG. 20(c) is formed by casting, and thin metal layers are stacked up to be formed by cladding.

Thus, a method of joining independently prepared members may be employed. However, it is preferable that the movable portion 4, the fixing portion 5, the thin plate portions 6 and 7 are formed by a method using a ceramic green sheet excellent in productivity and reliability, and then a piezoelectric/electrostrictive element is formed by film forming method.

4. Application Example of the Device

Lastly, as an application example of a device of the present invention, an example in which a device of the present invention is applied to a displacement element for an optical shutter is described with reference to drawings. Meanwhile, it could be easily understood that FIGS. 22(*a*) and 22(*b*), and FIGS. 23(*a*) to 23(*c*) exemplarily show devices of the present invention applied to displacement elements for optical shutters, and do not accurately show structures according to the present application. By the way, "optical shutter" in the present specification means a functional element for controlling transmitting and shielding of the light by relatively moving two shields, and can be functioned as an optical switch or an optical diaphragm, as the optical shutter can perform ON/OFF control or control of quantity of the light.

When a device of the present invention is mounted on an optical shutter, at least one out of two shields is fixed on a movable portion of a device of the present invention.

Figure 22A:
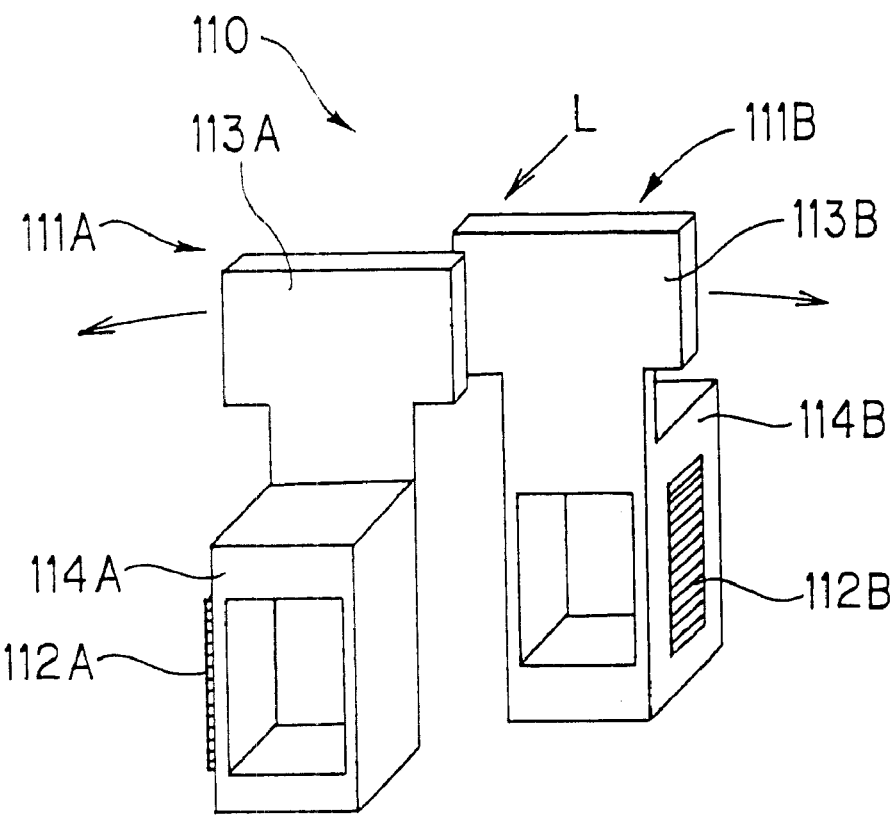
FIGS. 22(a) and (b) show schematic explanatory views of an embodiment of an optical shutter of the present invention.
Figure 22B:
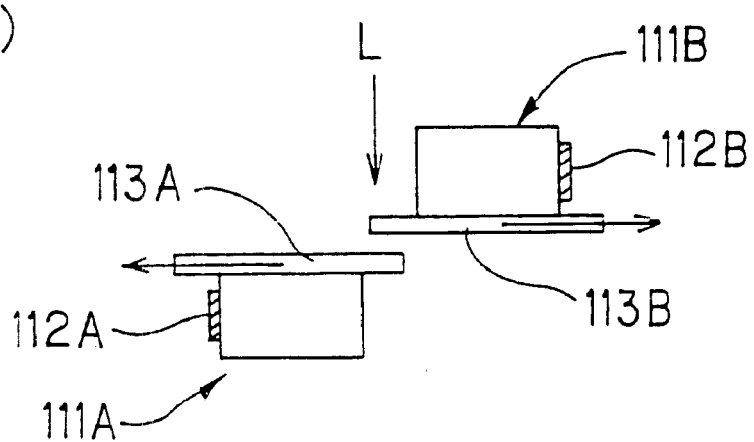

For example, an optical shutter 110 shown in FIGS. 22(*a*) and (*b*), comprises two units 111A and 111B respectively provided with a device of the present invention and a shield, and two shields 113A and 113B are respectively mounted on movable portions 114A and 114B of the device, and arranged to have respective planar surfaces to be parallel, and parts of the planar surfaces to be mutually overlapped against the incident direction of the light L.

Although the optical shutter 110 shields the light L in the state shown, by applying a voltage of the same phase to piezoelectric/electrostrictive elements 112A and 112B formed on driving portions of the devices, the shield 113A moves to the left in FIG. 22(*a*), and the shield 113B moves to the right in FIG. 22(*a*), causing the overlapping condition of the shields 113A and 113B to change, thus enabling ON/OFF control and control of quantity of the light.

Figure 23A:
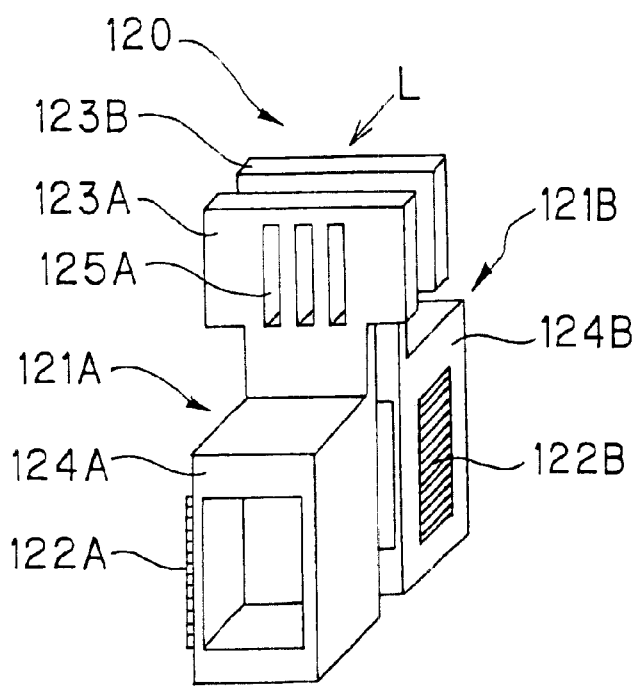
FIG. 23(a) shows a perspective view thereof.
Figure 23C:
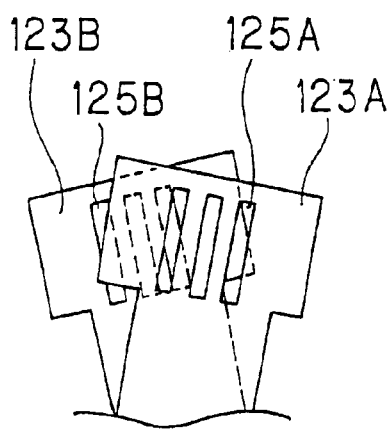
FIG. 23(c) shows an enlarged view of a shield thereof.
Figure 23B:
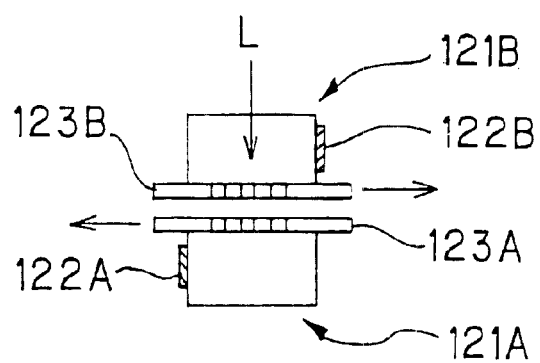
FIG. 23(b) shows a top view thereof.

Further, an optical shutter 120 shown in FIG. 23(*a*) comprises two units 121A and 121B respectively provided with a device of the present invention and a shield, and two shields 123A and 123B are respectively mounted on movable portions 124A and 124B, and arranged to have mutual planar surfaces to be parallel, and to have entirety of the planar surfaces to be totally overlapped against the incident direction of the light L. And slits 125A and 125B are respectively formed at opposing positions on the shields 123A and 123B.

Although the optical shutter 120 transmit the light L through the slits 125A and 125B in the state shown in FIGS. 23(*a*) and (*b*), by applying a voltage of the same phase to piezoelectric/electrostrictive elements 122A and 122B formed on the driving portions of the device, the shield 123A moves to the left and shield 123B moves to the right in FIG. 23(*b*), causing the overlapping condition of the slits 125A and 125B to change, thus enabling ON/OFF control and control of quantity of the light. FIG. 23(*c*) shows a state where a part of the light is transmitted, and by changing shapes and formation positions of the slits 123A and 123B, the light L can be completely shielded.

Contrarily, in the state shown in FIGS. 23(*a*) and (*b*), the slits 125A and 125B may be constituted not to overlap each other but to shield the light L, and may be structured such that the slits 125A and 125B are overlapped by the movement of the shields 123A and 123B enabling the light L to transmit. In examples related to FIGS. 22(*a*) and (*b*), and FIGS. 23(*a*), (*b*), and (*c*), examples where two shields are fixed on respective devices are shown, however, in an optical shutter of the present invention, at least one shield is fixed on a device, and only by moving the one shield, transmitting and shielding of the light can be controlled. However, it is more preferable to have both shields fixed on the devices, as the relative movement quantity of the shields can be increased. Though the optical shutter comprises two units in the examples of FIGS. 22(*a*) and (*b*), and FIGS. 23(*a*), (*b*), and (*c*), the shutter may comprise three or more units. In this case, by setting a variety of moving directions for a plurality of shields, the optical shutter may also be used as an optical diaphragm or the like having varied degrees of aperture of the overlapped portion. An optical shutter of the present invention can suppress operation of a shield in a flapping direction, as the shield is provided on a movable portion of a device of the present invention. In other words, as the shield always moves facing straight to the incident direction of the light, ON/OFF control and control of quantity of the light are made possible in higher precision, thus the optical shutter can be preferably used.

A device of the present invention is hereinbelow described on the basis of Example and Comparative Example. However, the present invention is by no means limited to the Example and the Comparative Example.

EXAMPLE

Each device having a structure shown in FIG. 25 was produced with the below-mentioned number of layers for piezoelectric/electrostrictive operating portion. The fixing portion, the thin plate portions, and the movable portion, which constitute the base, are made of a material containing zirconia as a main component and integrated by firing. There were used a material containing lead titanate—lead zirconate—lead magnesium niobate as a main component for a piezoelectric/electrostrictive layer of a piezoelectric/electrostrictive element, a material containing platinum as a main component for an electrode, and a material containing silver as a main component for a terminal electrode. To the aforementioned unitarily fired base, they were formed by screen printing method to integrate with the base by firing. After being fired, the piezoelectric/electrostrictive layer had a thickness of 12 $\mu$m, and the electrode had a thickness of 3 $\mu$m. Displacement was measured by using a laser Doppler vibrometer (by Graphtec Corporation.)

① A device was prepared with setting dimensions of each portion of the base shown in FIG. 8 to be a: 1300 $\mu$m, b: 255 $\mu$m, c: 1400 $\mu$m, d: 50 $\mu$m, e: 1200 $\mu$m, and f: 300 $\mu$m. The number of the layers for the piezoelectric/electrostrictive operating portion was four. A length of the piezoelectric/electrostrictive operating portion on the thin plate portions was 75% of that of the thin plate portions.

At that time, displacement of the device was 1 $\mu$m under an applied voltage of 60V, and resonance frequency was 50 kHz.

② A device was prepared with setting dimensions of each portion of the base shown in FIG. 8 to be a: 600 $\mu$m, b: 300 $\mu$m, c: 620 $\mu$m, d:10 $\mu$m, e: 1000 $\mu$m, and f:300 $\mu$m. The number of the layer for the piezoelectric/electrostrictive operating portion was one. A length of the piezoelectric/electrostrictive operating portion on the thin plate portion was 75% of that of the thin plate portion.

At that time, displacement of the device was 1.5 $\mu$m under an applied voltage of 60V, and resonance frequency was 10 kHz.

Comparative Example

Figure 25:
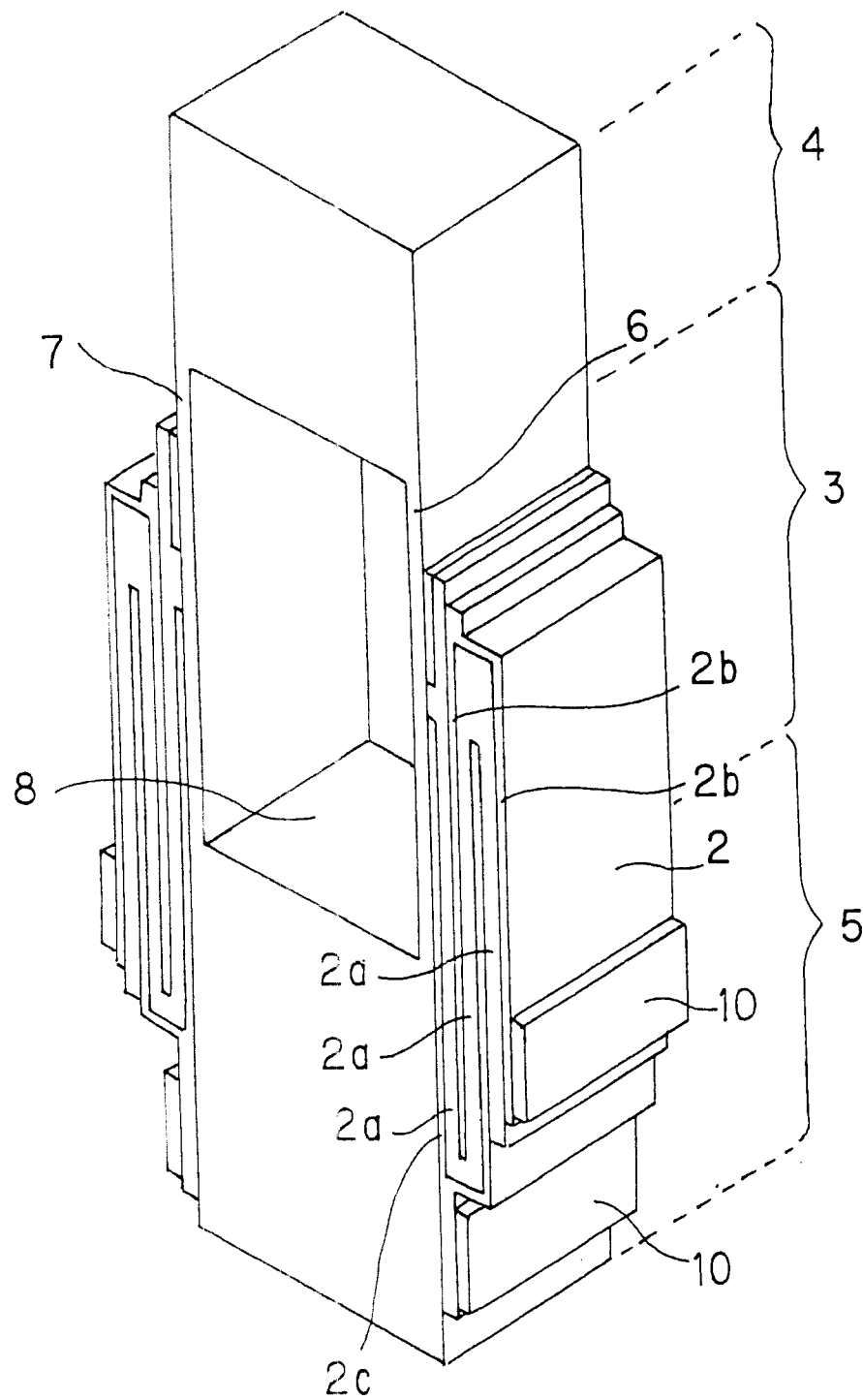
FIG. 25 shows a schematic perspective view of still another embodiment of a piezoelectric/electrostrictive device of the present invention.
Figure 26:
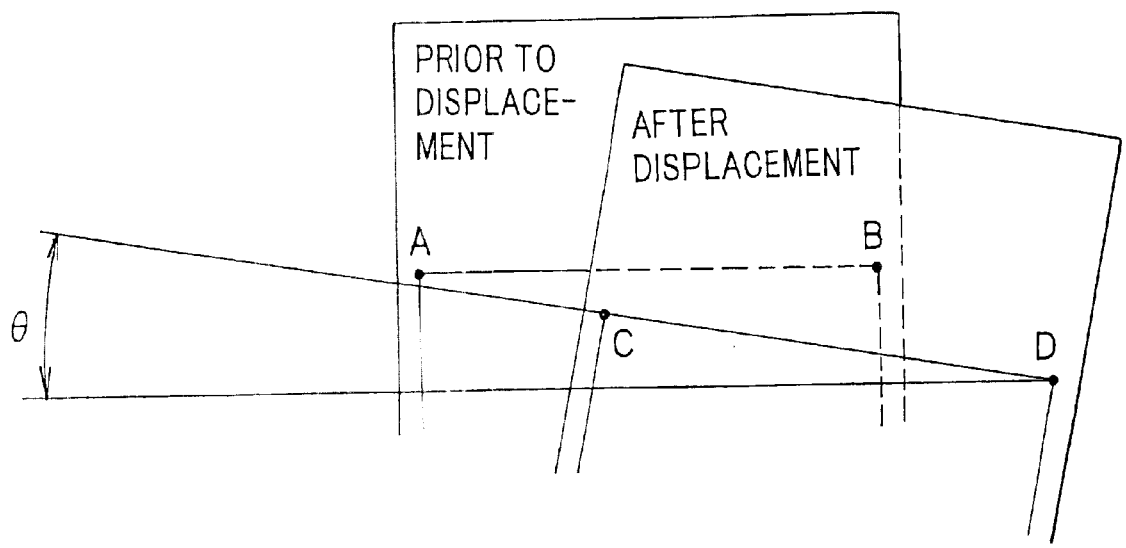
FIG. 26 shows a schematic explanatory view for describing the definition of a displacement in a piezoelectric/electrostrictive device of the present invention.

A piezoelectric/electrostrictive operating portion was formed so as to be present only on the thin plate portions on the basis of the structure shown in FIG. 25. A length of the piezoelectric/electrostrictive operating portion was 75% of that of the thin plate portion. The number of the layer for the piezoelectric/electrostrictive operating portion was one. The other conditions such as a method and material for forming the base and a method, material, and thickness for forming the piezoelectric/electrostrictive element were the same as in Example.

A device was prepared with setting dimensions of each portion of the base shown in FIG. 8 to be a: 600 μm, b: 300 μm, c: 620 μm, d: 10 μm, e: 1000 μm, and f: 300 μm. At that time, displacement of the device was 0.2 μm under an applied voltage of 60V, and resonance frequency was 8 kHz.

The above results show that a large displacement can be obtained in a structure according to the present invention. In addition, the results show that a structure showing a large displacement and a high resonance frequency can be obtained by using 4 layers for the piezoelectric/electrostrictive operating portion if Example ① is compared with Example ②.

As a device according to the present invention has a feature of having a high stiffness in the width direction of a thin plate, namely in the Y-axis direction, the device has a structure that enables stronger bonding when functional members such as a sensor, a magnetic head, or the like is fixed to the device, or when the device per se is mounted on the other structure. In addition, because of this stiffness, the device also has a feature that a member of relatively large mass can also be mounted. Further, as the stiffness in the thickness direction is, in comparison with the width direction, relatively smaller, an effect is displayed that, when the device is driven based on the directional property of the stiffness, the displacement component in the Y-axis direction, namely n flapping component, is effectively suppressed.

Moreover, a device according to the present invention has one end of a piezoelectric/electrostrictive operating portion arranged on the fixing portion or the movable portion, and the other end of the piezoelectric/electrostrictive operating portion arranged on the thin plate portion, a displacement of a piezoelectric/electrostrictive element is developed having the joined portion of the fixing portion with the thin plate portion, or the joined portion of the movable portion with the thin plate portion as the fulcrum. As the displacement mechanism has a structure that makes the thin plate portion bend and displaces such that the joined portion of the movable portion with the thin plate portion is largely displaced in a direction toward the outer space, the movable portion can be made to be displaced in still larger magnitude.

In addition, as a device of the present invention has a displacement path of the movable portion made substantially parallel to the fixing portion, the device has a feature that operation with very little pitching can be realized when a member such as a sensor, and the like is fixed at the tip of the movable portion. The displacement mechanism which enables a displacement substantially in parallel is derived from above-described arrangements of a piezoelectric/electrostrictive operating portion and a piezoelectric/electrostrictive layer, and the relationship of the Young's moduli of a material of the thin plate portion and a piezoelectric/electrostrictive material, and is made preferably attainable by making the displacement mode of the thin plate portion due to operation of a piezoelectric/electrostrictive element have the inflection point for the displacement. The structure, which enables operation in substantially parallel, effectively displaces a limited portion of low stiffness of the thin plate portion under the above-described conditions, and therefore, displacement efficiency is extremely high, and as the result, an effect is displayed that the movable portion is displaced in still larger magnitude. Moreover, as the substrate comprising a movable portion, thin plate portions, and a fixing portion is an integrated body by simultaneous sintering, and a piezoelectric/electrostrictive element is also integrated with the thin plate portion by heat treatment without using any adhesives, thus respective members are unrelated with adhering integration, and therefore the device has features that joined portions are superior in reliability, and have high stiffness, and as the result, high resonant frequency as a structure is facilitated. In other words, the device is of a structure where a large displacement in a specific one axis can be obtained with a relatively low voltage, and which is superior in responsibility, and has a small variation in characteristics for elongated usage.

Therefore, the device can be utilized not only for active elements such as a variety of transducers, a variety of actuators, frequency regional functional members (filters), transformers, vibrators and resonators for communication and power uses, oscillators, discriminators, and the like, but also as sensor elements for a variety of sensors, such as ultra-sonic sensors and acceleration sensors, angular velocity sensors and impact sensors, mass sensors, and the like, and can be preferably utilized for a variety of actuators used specifically for mechanisms for displacement adjustment or angular adjustment, or positioning adjustment of a variety of precision parts of optical apparatuses, precision apparatuses, and the like.

What is claimed is:

1. A piezoelectric/electrostrictive device comprising a driving portion to be driven by displacement of a piezoelectric/electrostrictive element, a movable portion to be operated by displacement of said driving portion, a fixing portion for holding said driving portion and said movable portion, said movable portion being coupled with said fixing portion via said driving portion, and a hole formed by inner walls of said driving portion, an inner wall of said movable portion, and an inner wall of said fixing portion, said driving portion comprising a pair of mutually opposing thin plate portions, and a piezoelectric/electrostrictive element including a piezoelectric/electrostrictive operating portion comprising a pair or more of electrodes and a ceramic piezoelectric/electrostrictive layer arranged on at least a part of the outer surface of at least one of said thin plate portions, one end of said piezoelectric/electrostrictive operating portion in a direction in which said fixing portion is connected with said movable portion exists on said fixing portion or said movable portion, and the other end of said piezoelectric/electrostrictive operating portion is arranged on said thin plate portion; and at least one end of said ceramic piezoelectric/electrostrictive layer of said piezoelectric/electrostrictive element exists on said fixing portion or said movable portion, and the other end thereof is arranged on said thin plate portion, the Young's modulus Y1 of a material composing said thin plate portions and the Young's modulus Y2 of a material composing said ceramic piezoelectric/electrostrictive layer have a relationship satisfying the following expression:

$$1 < Y1/Y2 \leq 20.$$

2. A piezoelectric/electrostrictive device according to claim 1, wherein said movable portion, said thin plate portions, and said fixing portion are integrally formed by simultaneously sintering a ceramic green sheet laminated body.

3. A piezoelectric/electrostrictive device according to claim 1, wherein said piezoelectric/electrostrictive element is a film-like piezoelectric/electrostrictive element first formed directly on said thin plate portion and said movable portion or said fixing portion, and is then integrally formed by sintering.

4. A piezoelectric/electrostrictive device according to claim 3, wherein said ceramic piezoelectric/electrostrictive layer of said film-like piezoelectric/electrostrictive element is free of glass frit.

5. A piezoelectric/electrostrictive device according to claim 1, wherein said movable portion displaces so as to satisfy the following expression relative to an angle, θ, formed by one side of said movable portion opposing to said fixing portion in a displaced state and the same one side of said movable portion prior to the displacement, the expression being:

$$0° \leq \theta \leq 0.1°.$$

6. A piezoelectric/electrostrictive device according to claim 1, wherein the length, L, of a portion, arranged on said thin plate portion, of said piezoelectric/electrostrictive operating portion satisfies the following expression relative to a relationship between the length, e, of said thin plate portion, and the thickness, d, the expression being:

$$30 \leq (L/e) \times 100 \leq 100 - d/2.5.$$

7. A piezoelectric/electrostrictive device according to claim 6, wherein, in a virtual circle having the center thereof on a perpendicular dropped to said fixing portion from the middle point of one side of said movable portion opposing to said fixing portion in a non-displaced state, and passing through the middle point of the movable portion in said non-displaced state and the middle point of the movable portion displaced by operation of said driving portion, the movable portion displaces such that a relationship between the radius, r, of said virtual circle and the length, e, of said thin plate portion satisfies the following expression:

$$0 \leq e/r \leq 100,$$

and when driven by displacement of said piezoelectric/electrostrictive element, an inflection point for the displacement exists on said thin plate portion.

8. A piezoelectric/electrostrictive device according to claim 6, wherein the length, L, of said piezoelectric/electrostrictive operating portion arranged on said thin plate portion satisfies the following expression relative to a relationship between the length, e, of said thin plate portion and the thickness, d, of said thin plate portion, the expression being:

$$40 \leq (L/e) \times 100 \leq 100 - d/1.5.$$

9. A piezoelectric/electrostrictive device according to claim 8, wherein, in a virtual circle having the center thereof on a perpendicular dropped to said fixing portion from the middle point of one side of said movable portion opposing to said fixing portion in a non-displaced state, and passing through the middle point of said movable portion in said non-displaced state and the middle point of said movable portion displaced by operation of said driving portion, said movable portion displaces such that a relationship between the radius, r, of said virtual circle and the length, e, of said thin plate portion satisfies the following expression:

$$0 \leq e/r \leq 20,$$

and an inflection point for the displacement of said thin plate portion exists at a position spaced by one half or more of the length of said thin plate portion from a joined portion between said thin plate portion and said fixing portion or said movable portion, the piezoelectric/electrostrictive operating portion existing on either said fixing portion or said movable portion.

10. A piezoelectric/electrostrictive device according to claim 1, wherein the thickness, a, of said hole and the length, e, of said thin plate portion have a ratio expressed by e/a which is 0.1 to 2, and the thickness, a, of said hole and the width, b, of said thin plate portion have a ratio expressed by a/b which is 0.05 to 2.

11. A piezoelectric/electrostrictive device according to claim 1, comprising a plurality of piezoelectric/electrostrictive elements, wherein at least one of said piezoelectric/electrostrictive elements has a multi-layered piezoelectric/electrostrictive operating portion.

* * * * *